US012690348B2

(12) United States Patent
Woo et al.

(10) Patent No.: US 12,690,348 B2
(45) Date of Patent: Jul. 21, 2026

(54) DISPLAY DEVICE

(71) Applicant: Samsung Display Co., Ltd., Yongin-si (KR)

(72) Inventors: Heeju Woo, Yongin-si (KR); Cholong Won, Yongin-si (KR); Kikyung Youk, Yongin-si (KR); Seung-Soo Ryu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 18/470,541

(22) Filed: Sep. 20, 2023

(65) Prior Publication Data

US 2024/0122011 A1    Apr. 11, 2024

(30) Foreign Application Priority Data

Oct. 5, 2022    (KR) ........................ 10-2022-0127043

(51) Int. Cl.
*H10K 59/131*      (2023.01)
*H10K 59/124*      (2023.01)
*H10K 59/40*       (2023.01)

(52) U.S. Cl.
CPC ......... *H10K 59/131* (2023.02); *H10K 59/124* (2023.02); *H10K 59/40* (2023.02)

(58) Field of Classification Search
CPC .... H10K 59/131; H10K 59/124; H10K 59/40; H10D 86/441
USPC ........................................................ 257/40
See application file for complete search history.

(56) References Cited

U.S. PATENT DOCUMENTS

| | | | | |
|---|---|---|---|---|
| 2019/0189721 A1* | 6/2019 | Kim | ................... | G02F 1/136227 |
| 2020/0264732 A1* | 8/2020 | Lee | ........................ | G06F 3/0446 |
| 2020/0286961 A1* | 9/2020 | Jeong | .................... | G06F 3/0443 |
| 2021/0202686 A1* | 7/2021 | Jeon | ........................ | G09F 9/302 |
| 2023/0209934 A1* | 6/2023 | Kim | ................... | H10K 59/1213 |
| | | | | 345/204 |
| 2024/0029633 A1* | 1/2024 | Won | ......................... | G09G 3/32 |

FOREIGN PATENT DOCUMENTS

KR            10-0138707         6/1998

* cited by examiner

*Primary Examiner* — Moazzam Hossain
(74) *Attorney, Agent, or Firm* — Lerner David LLP

(57)          ABSTRACT

A display device includes a first conductive pattern layer connected to a signal line, a second conductive pattern layer connected to the first conductive pattern layer, and an insulation pattern layer disposed between the signal line and the second conductive pattern layer and overlapping the second conductive pattern layer. The second conductive pattern layer exposes a portion of an upper surface and a side surface of the insulation pattern layer. The second conductive pattern layer includes first and second edge portions disposed on the upper surface of the insulation pattern layer and facing each other in a second direction intersecting a first direction. A distance between the first and second edge portions decreases as moving along the first direction in a first region of the upper surface of the insulation pattern layer, and increases as moving along the first direction in a second region of the upper surface.

19 Claims, 26 Drawing Sheets

ISU

E2-1   E2-2   CH-I   CPL2   SP2   E2-3   E2-4

E1-1

SPL1

CP1

E1-2

E1-3

E1-4

E1-5

IS-DA

IS-NDA

SL2

SL1

DR1

DR2

DR3

PA1/PA2

IS-IL
40
30
20
10
BFL
BRL

I                                                                                              I'

CNT2 CNT1 DL-E     CL1 CL2
                   ⎣___⎦
                   DP-PD

DR3
DR2 ← ⊗
       DR1

CL1-OP1          CL1-OP2

PA1/PA2

IS-IL
40
30
20
10
BFL
BRL

II                                                                                            II'

CNT2   DL-E     CL1 CL2
                ⎣___⎦
                DP-PD

DR3
DR2 ← ⊗
       DR1

DISPLAY DEVICE

CROSS-REFERENCE TO RELATED APPLICATION(S)

This application claims priority to and benefits of Korean Patent Application No. 10-2022-0127043 under 35 U.S.C. § 119, filed on Oct. 5, 2022, the entire contents of which are incorporated herein by reference.

BACKGROUND

1. Technical Field

Embodiments relate to a display device including a pad region.

2. Description of the Related Art

Various display devices have been developed to be used in multimedia devices such as televisions, mobile phones, tablet computers, navigation units, and game consoles. The display devices include keyboards, mouses, or the like, as an input device. The display devices include an input sensor such as a touch panel, as an input device.

The display devices each include a display panel and a circuit board. The display panel may be connected to a main board through the circuit board. A driving chip may be mounted in the display panel.

SUMMARY

Embodiments provide a display device including a signal pad capable of reducing or minimizing bonding defects thereof.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include a base layer, a pixel disposed on the base layer, a signal line electrically connected to the pixel, a signal pad connected to the signal line, and a plurality of insulation layers disposed on the base layer. The signal pad may include a first conductive pattern layer connected to the signal line, a second conductive pattern layer connected to the first conductive pattern layer, and at least one insulation pattern layer disposed between the signal line and the second conductive pattern layer in a cross-sectional view and overlapping the second conductive pattern layer in a plan view. The plurality of insulation layers may include a first group of insulation layers disposed between the signal line and the first conductive pattern layer, and the signal line and the first conductive pattern layer may be connected to each other through a first contact hole formed in the first group of insulation layers. The second conductive pattern layer may expose a portion of an upper surface and a side surface of the at least one insulation pattern layer. The second conductive pattern layer may include a first edge portion and a second edge portion that are disposed on the upper surface of the at least one insulation pattern layer and face each other in a second direction intersecting a first direction. A distance between the first edge portion and the second edge portion may decrease as moving along the first direction in a first region of the upper surface of the at least one insulation pattern layer, and may increase as moving along the first direction in a second region of the upper surface of the at least one insulation pattern layer.

In an embodiment, the plurality of insulation layers may further include a second group of insulation layers disposed between the first conductive pattern layer and the second conductive pattern layer. The first conductive pattern layer and the second conductive pattern layer may be connected to each other through a second contact hole formed in the second group of insulation layers.

In an embodiment, the first contact hole may be disposed inside the second contact hole in a plan view.

In an embodiment, the at least one insulation pattern layer may be disposed outside the first contact hole in a plan view.

In an embodiment, the at least one insulation pattern layer may be in contact with an upper surface of the first conductive pattern layer.

In an embodiment, the first contact hole may include a plurality of first contact holes, and the plurality of first contact holes may be disposed along the first direction.

In an embodiment, the at least one insulation pattern layer may include a plurality of insulation pattern layer, and the plurality of insulation pattern layers may be disposed along the first direction. Each of the plurality of insulation pattern layers may be disposed between two adjacent contact holes among the plurality of first contact holes.

In an embodiment, the second conductive pattern layer may include a first region overlapping the first contact hole, and a second region overlapping the at least one insulation pattern layer in a plan view. A width of the first region of the second conductive pattern layer in the second direction may be greater than a width of the second region of the second conductive pattern layer in the second direction.

In an embodiment, the upper surface of the at least one insulation pattern layer may include first and second upper surface edge portions substantially extending in the first direction, and third and fourth upper surface edge portions substantially extending in the second direction. The third upper surface edge portion may be greater than the first upper surface edge portion.

In an embodiment, a maximum distance between a concave point of the first edge portion and the first upper surface edge portion may be about 0.5 micrometers to about 1.5 micrometers.

In an embodiment, the third upper surface edge portion may have a length of about 5 micrometers to about 8 micrometers, and the first upper surface edge portion may have a length of about 3 micrometers to about 5 micrometers.

In an embodiment, the at least one insulation pattern layer may be disposed inside the first conductive pattern layer in a plan view.

In an embodiment, the at least one insulation pattern layer may be in contact with an upper surface of the first group of insulation layers.

In an embodiment, the second conductive pattern layer may be disposed on an upper surface of the first conductive pattern layer.

In an embodiment, an opening portion, which exposes the portion of the upper surface of the at least one insulation pattern layer and the side surface of the at least one insulation pattern layer, may be formed in the second conductive pattern layer.

In an embodiment, the plurality of insulation layers may further comprise a second group of insulation layers disposed between the first conductive pattern layer and the second conductive pattern layer, and the first conductive pattern layer and the second conductive pattern layer are connected to each other through a second contact hole formed in the second group of insulation layers, and the at least one insulation pattern layer may be disposed inside the first contact hole and the second contact hole in a plan view.

In an embodiment, the at least one insulation pattern layer may be in contact with the upper surface of the first conductive pattern layer inside the first contact hole and the second contact hole in a plan view.

In an embodiment, the first contact hole may include a plurality of first contact holes, and the plurality of first contact holes may be disposed in the first direction.

In an embodiment, the at least one insulation pattern layer may include bonding portions disposed between the plurality of first contact holes in the first direction, and a connection portion that connects the bonding portions to each other and overlaps a corresponding contact hole among the plurality of first contact holes.

In an embodiment, a display device may include a base layer, a signal line disposed on the base layer, a signal pad connected to the signal line, and a first group of insulation layers disposed on the base layer. The signal pad may include a first conductive pattern layer connected to an end portion of the signal line, a second conductive pattern layer connected to the first conductive pattern layer, and an insulation pattern layer disposed between the end portion of the signal line and the second conductive pattern layer in a cross-sectional view and overlapping the second conductive pattern layer in a plan view. The first group of insulation layers may be disposed between the end portion of the signal line and the first conductive pattern layer, and the end portion of the signal line and the first conductive pattern layer may be connected to each other through a first contact hole formed in the first group of insulation layers. The second conductive pattern layer may include a first edge portion and a second edge portion that face each other in a second direction intersecting a first direction. The first edge portion may include a first region extending in a first oblique direction intersecting the first direction and the second direction and overlapping an upper surface of the insulation pattern layer, and a second region extending in a second oblique direction intersecting the first oblique direction and overlapping the upper surface of the insulation pattern layer. The second edge portion may include a first region facing the first region of the first edge portion, extending in the second oblique direction, and overlapping the upper surface of the insulation pattern layer, and a second region facing the second region of the first edge portion, extending in the first oblique direction, and overlapping the upper surface of the insulation pattern layer.

In an embodiment, a display device may include a base layer, a pixel disposed on the base layer, a signal line electrically connected to the pixel, a signal pad connected to the signal line, and a plurality of insulation layers disposed on the base layer. The signal pad may include a first conductive pattern layer connected to the signal line, a second conductive pattern layer connected to the first conductive pattern layer, and at least one insulation pattern layer disposed between the signal line and the second conductive pattern layer in a cross-sectional view and overlapping the second conductive pattern layer in a plan view. The plurality of insulation layers may include a first group of insulation layers disposed between the signal line and the first conductive pattern layer, and the signal line and the first conductive pattern layer may be connected to each other through a first contact hole formed in the first group of insulation layers. The second conductive pattern layer may expose a portion of an upper surface and a side surface of the at least one insulation pattern layer. The second conductive pattern layer may include a first edge portion and a second edge portion that face each other in a second direction intersecting a first direction. The upper surface of the at least one insulation pattern layer may include a first upper surface edge portion facing the first edge portion and a second upper surface edge portion facing the second edge portion. A distance between the first edge portion and the first upper surface edge portion may increase as moving along the first direction in a first region of the upper surface of the at least one insulation pattern layer, and may decrease as moving along the first direction in a second region of the upper surface of the at least one insulation pattern layer.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain principles of the invention. In the drawings.

DETAILED DESCRIPTION OF THE EMBODIMENTS

Figure 1A:
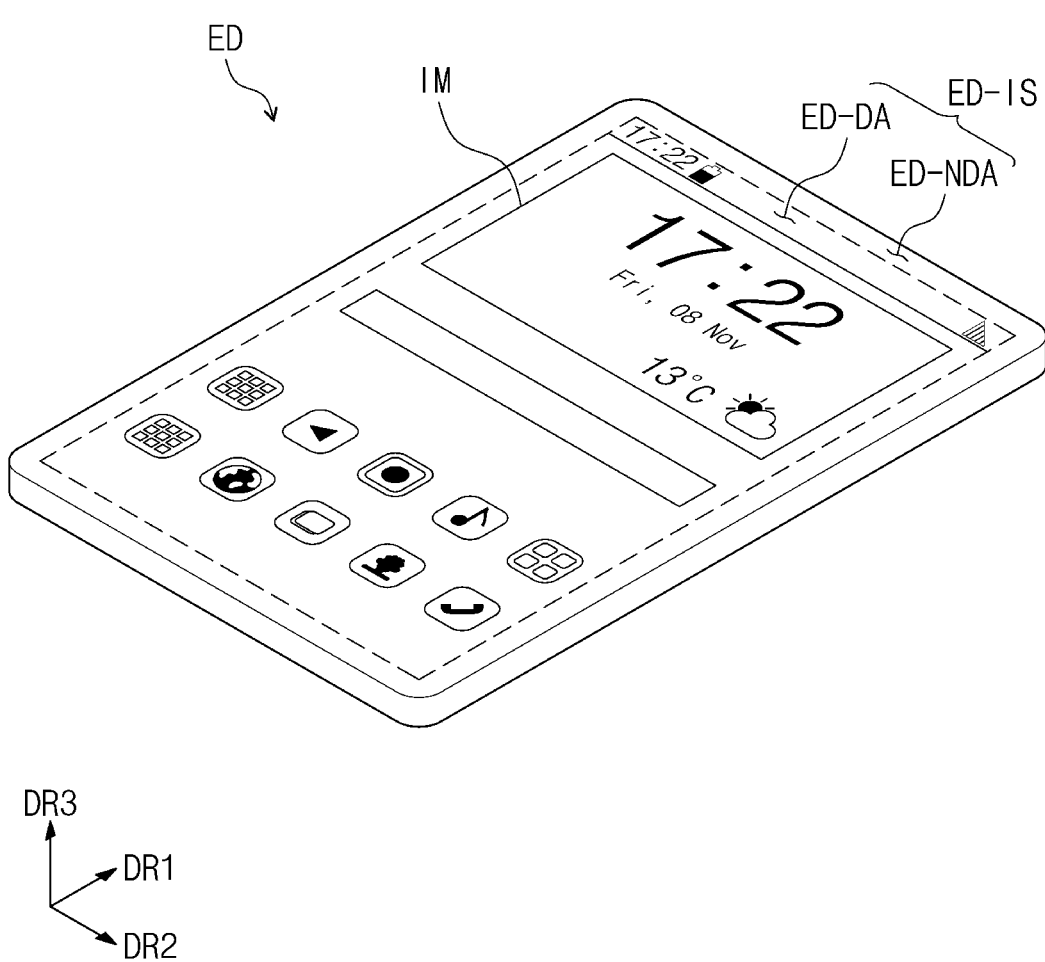
FIG. 1A is a schematic perspective view of an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to the accompanying drawings.

Figure 1B:
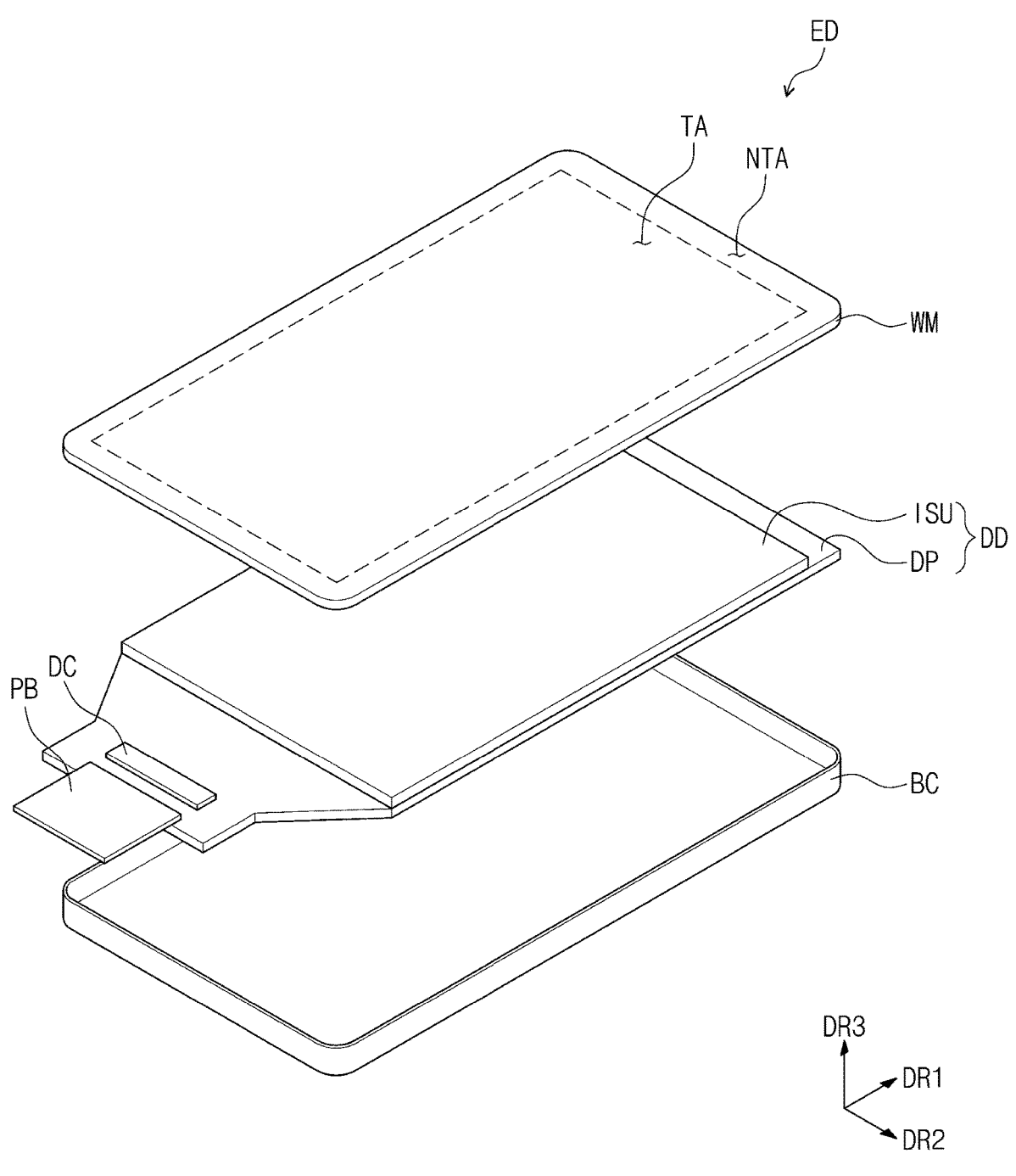
FIG. 1B is an exploded perspective view of an electronic device according to an embodiment.
Figure 1C:
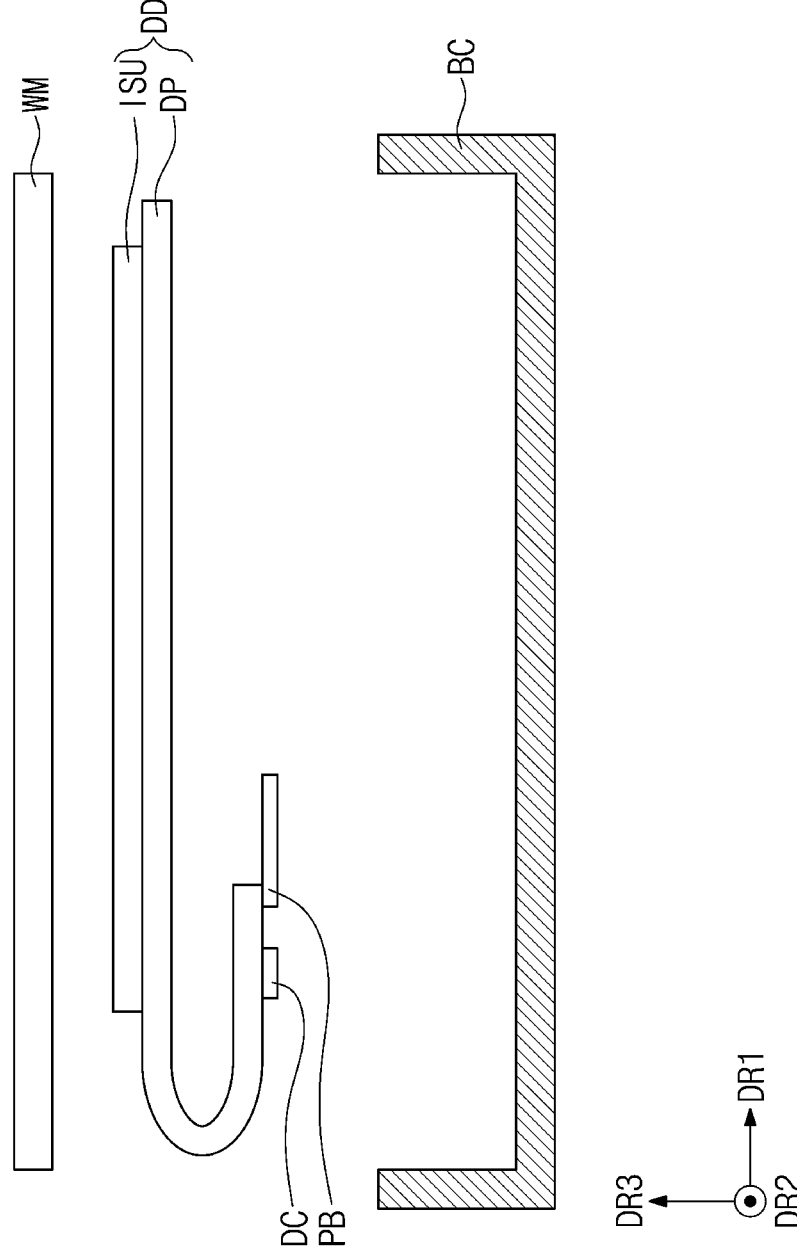
FIG. 1C is a schematic cross-sectional view of an electronic device according to an embodiment.

FIG. 1A is a schematic perspective view of an electronic device ED according to an embodiment. FIG. 1B is an exploded perspective view of an electronic device ED according to an embodiment. FIG. 1C is a schematic cross-sectional view of an electronic device according to an embodiment.

FIGS. 1A to 1C illustrate a smartphone terminal as an example of the electronic device ED. The electronic device ED according to an embodiment may be applied to large-sized electronic devices such as televisions and monitors, and also to small and medium-sized electronic devices such as tablet computers, vehicle navigation units, game consoles, and smartwatches.

Referring to FIG. 1A, the electronic device ED may display an image IM through a display surface ED-IS. Icon images are illustrated as an example of the image IM. The display surface ED-IS may be parallel to a plane defined by a first direction DR1 and a second direction DR2. A third direction DR3 indicates a normal direction to the display surface ED-IS, i.e., a thickness direction of the electronic device ED. In the disclosure, "when viewed in a plan view" or "in a plan view" may mean being viewed in the third direction DR3. A front surface (or top surface) and a rear surface (or bottom surface) of each of layers or units to be described below are defined by the third direction DR3.

The display surface ED-IS may include a display region ED-DA in which the image IM is displayed, and a non-display region ED-NDA adjacent to the display region ED-DA. The non-display region ED-NDA may be a region in which an image is not displayed. However, embodiments are not limited thereto, and the non-display region ED-NDA may be adjacent to a side of the display region ED-DA or may be omitted.

Referring to FIGS. 1B and 1C, the electronic device ED may include a window WM, a display device DD, and a housing BC. The housing BC may accommodate the display device DD and be coupled to the window WM. For example, the electronic device ED may further include other electronic modules that are accommodated in the housing BC to be electrically connected to the display device DD. For example, the electronic device ED may further include a main board, and a circuit module, a camera module, a power module, and so on, which are mounted on the main board.

The window WM may be disposed above the display device DD, and an image provided from the display device DD may be transmitted to the outside through the window WM. The window WM may include a transmission region TA and a non-transmission region NTA. The transmission region TA may overlap the display region ED-DA and have a shape corresponding to the display region ED-DA.

The non-transmission region NTA may overlap the non-display region ED-NDA and have a shape corresponding to the non-display region ED-NDA. The non-transmission region NTA may have a relatively lower light transmittance than the transmission region TA. A bezel pattern may be disposed in a partial region of a base layer. A region in which the bezel pattern is disposed may be the non-transmission region NTA, and a region in which the bezel pattern is not disposed may be the transmission region TA. The base layer of the window WM may be made of glass, sapphire, plastic, or the like. However, embodiments are not limited thereto, and the non-transmission region NTA may be omitted.

The display device DD may generate an image and detect an external input. The display device DD may include a display panel DP and an input sensor ISU. For example, the display device DD may further include an anti-reflection member disposed on the input sensor ISU. The anti-reflection member may include a polarizer and a retarder or include a color filter and a black matrix.

According to an embodiment, the display panel DP may be a light emitting display panel, and the type of the display panel DP is not limited thereto. For example, the display panel DP may be an organic light emitting display panel or an inorganic light emitting display panel. A light emitting layer of the organic light emitting display panel may include an organic luminescent material. A light emitting layer of the inorganic light emitting display panel may include a quantum dot, a quantum rod, a nano LED, or the like. Hereinafter, the display panel DP is described as the organic light emitting display panel.

The input sensor ISU may include one of a capacitive sensor, an optical sensor, an ultrasonic sensor, and an electromagnetic induction sensor. The input sensor ISU may be formed on the display panel DP by a continuous process, or may be separately manufactured and then attached to an upper side of the display panel DP by an adhesive layer.

The display device DD may further include a driving chip DC and a circuit board PB. An embodiment in which the driving chip DC is mounted on the display panel DP is illustrated, but embodiments are not limited thereto. The driving chip DC may generate a driving signal required for an operation of the display panel DP based on a control signal received from the circuit board PB. The circuit board PB bonded to the display panel DP may be bent to be disposed on a rear surface of the display panel DP. The circuit board PB may be disposed at one end portion of a base layer BL and electrically connected to a driving element layer (DP-CL).

FIG. 1B illustrates a state before a portion of the display panel DP is bent. FIG. 1C illustrates a state after the portion of the display panel DP is bent. The display panel DP may be seated in the housing BC in a state in which the portion of the display panel DP is bent. The non-display region DP-NDA (see FIG. 3) of the display panel DP may be bent. The portion of the display panel DP may be bent so that the driving chip DC may be disposed to face the housing BC.

The smartphone terminal is described as an example of the electronic device ED, but the electronic device ED may be applicable as long as including two or more electronic components bonded to each other. The display panel DP and the driving chip DC mounted on the display panel DP correspond to different components, and the electronic device ED may be formed by these components. The electronic device ED may be formed by the display panel DP and the circuit board PB connected to the display panel DP, and the electronic device ED may be formed by the main board and an electronic module mounted on the main board. Hereinafter, the electronic device ED according to an embodiment is described with a focus on a bonding structure of the display panel DP and the driving chip DC mounted on the display panel DP.

Figure 2:
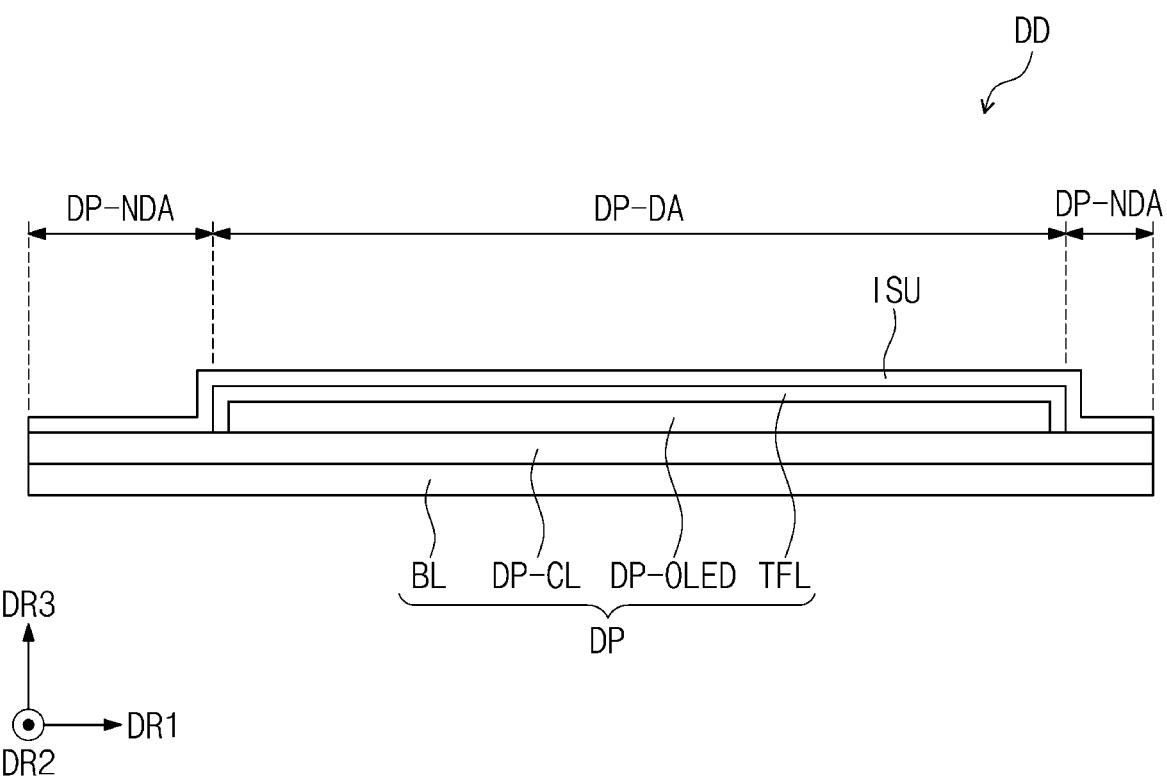
FIG. 2 is a schematic cross-sectional view of a display device according to an embodiment.
Figure 3:
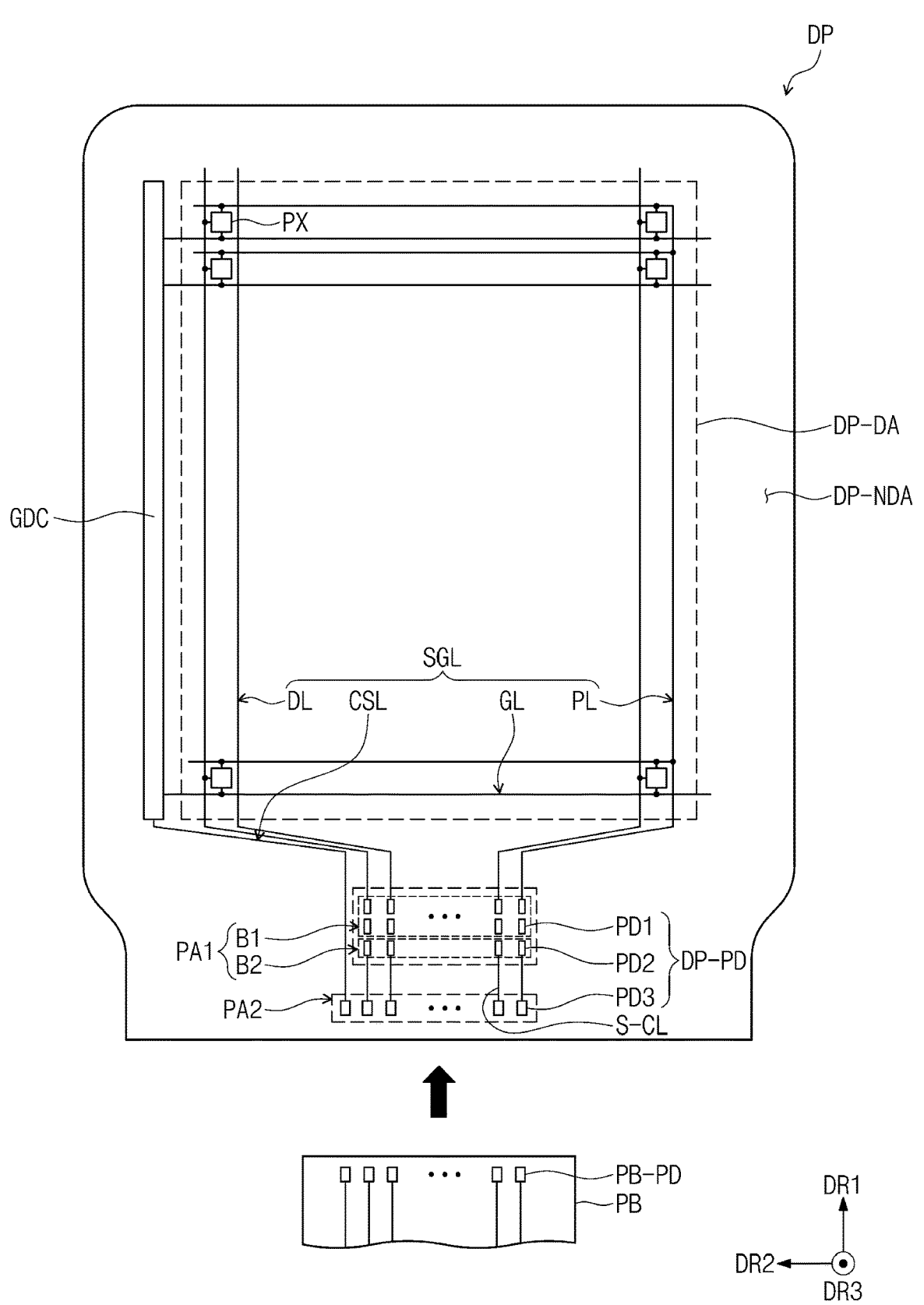
FIG. 3 is a schematic plan view of a display panel according to an embodiment.

FIG. 2 is a schematic cross-sectional view of a display device DD according to an embodiment. FIG. 3 is a schematic plan view of a display panel DP according to an embodiment.

Referring to FIG. 2, the display panel DP may include a base layer BL, and a driving element layer DP-CL, a display element layer DP-OLED, and an upper insulation layer TFL that are disposed on the base layer BL. An input sensor ISU may be disposed on the upper insulation layer TFL.

The display panel DP may include a display region DP-DA and a non-display region DP-NDA. The display region DP-DA of the display panel DP may correspond to the display region ED-DA illustrated in FIG. 1A or the transmission region TA illustrated in FIG. 1B, and the non-display region DP-NDA may correspond to the non-display region ED-NDA illustrated in FIG. 1A or the non-transmission region NTA illustrated in FIG. 1B.

The base layer BL may include at least one plastic film. The base layer BL may include a synthetic resin layer. The synthetic resin layer may include a thermoset resin. For example, the synthetic resin layer may be a polyimide-based resin layer, and the material thereof is not limited thereto. The synthetic resin layer may include at least one of an acrylic resin, a methacryl-based resin, polyisoprene, a vinyl-based resin, an epoxy-based resin, a urethane-based resin, a cellulose-based resin, a siloxane-based resin, a polyamide-based resin, or a perylene-based resin. For example, the base layer may include a glass substrate, a metal substrate, an organic/inorganic composite material substrate, or the like.

The driving element layer DP-CL may include at least one insulation layer and a circuit element. The insulation layer may include at least one inorganic layer and at least one organic layer. The circuit element may include signal lines, a driving circuit of a pixel, etc. The insulation layer, a semiconductor layer, and a conductive layer may be formed by a coating process, a deposition process, or the like. Thereafter, the insulation layer, the semiconductor layer, and the conductive layer may be selectively patterned by a photolithography process and an etching process. A semiconductor pattern, a conductive pattern layer, the signal lines, etc. may be formed by such processes. The patterns disposed on the same layer may be formed by the same process. Hereinafter, patterns being formed by the same process means that the patterns include the same material and has the same stacked structure.

The display element layer DP-OLED may include an organic light emitting element. The display element layer DP-OLED may further include an organic layer such as a pixel defining film.

The upper insulation layer TFL may seal the display element layer DP-OLED. In an example, the upper insulation layer TFL may include a thin film encapsulation layer. The thin film encapsulation layer may include a stacked structure of inorganic layer/organic layer/inorganic layer. The upper insulation layer TFL may protect the display element layer DP-OLED from moisture, oxygen, and foreign matters such as dust particles. However, embodiments are not limited thereto, and the upper insulation layer TFL may further include an additional insulation layer in addition to the thin film encapsulation layer. For example, an optical layer for controlling a refractive index may be further included.

In an embodiment, an encapsulation substrate may be provided instead of the upper insulation layer TFL. For example, the encapsulation substrate may oppose the base layer BL, and the driving element layer DP-CL and the display element layer DP-OLED may be disposed between the encapsulation substrate and the base layer BL.

The input sensor ISU may be disposed (e.g., directly disposed) on the display panel DP. In the disclosure, "a component A being disposed directly on a component B" means that an adhesive layer is not disposed between the component A and the component B. In an embodiment, the input sensor ISU may be manufactured by a continuous process with the display panel DP. However, embodiments are not limited thereto, and the input sensor ISU may be provided as a separate panel to be coupled to the display panel DP by an adhesive layer. In another example, the input sensor ISU may be omitted.

Referring to FIG. 3, the display panel DP may include a plurality of pixels PX, a gate driving circuit GDC, a plurality of signal lines SGL, and a plurality of signal pads DP-PD.

The pixels PX may be disposed in the display region DP-DA. Each of the pixels PX may include an organic light emitting element and a pixel driving circuit connected to the organic light emitting element. The gate driving circuit GDC may sequentially output gate signals to a plurality of gate lines GL. A transistor of the gate driving circuit GDC may be formed by the same process as a transistor of the pixel PX, for example, a low temperature polycrystalline silicon (LTPS) process or a low temperature polycrystalline oxide (LTPO) process. The display panel DP may further include another driving circuit that provides the pixels PX with an emission control signal.

The signal lines SGL may include the gate lines GL, data lines DL, a power line PL, and a control signal line CSL. Each of the gate lines GL may be connected to a corresponding pixel PX among the pixels PX, and each of the data lines DL may be connected to a corresponding pixel PX among the pixels PX. The power line PL may be connected to the pixels PX. The control signal line CSL may provide the gate driving circuit GDC with the control signals.

The signal lines SGL may overlap the display region DP-DA and the non-display region DP-NDA. Each of the signal lines SGL may include a pad portion and a line portion. The line portion may overlap the display region DP-DA and the non-display region DP-NDA. The pad portion may be connected to an end portion of the line portion. The pad portion may overlap a pad region to be described below.

The signal lines SGL may be disposed on a single layer to have a shape of a single body, but embodiments are not limited thereto. A single signal line SGL may include a plurality of portions disposed on different layers. For example, the line portion may include two or more portions disposed on different layers in the non-display region DP-NDA.

The plurality of signal pads DP-PD may include first pads PD1, second pads PD2, and third pads PD3. A region in which the first pads PD1 and the second pads PD2 are disposed may be defined as a first pad region PA1, and a region in which the third pads PD3 are disposed may be defined as a second pad region PA2. The first pad region PA1 may be a region to which the driving chip DC (see FIG. 1B) is bonded, and the second pad region PA2 may be a region to which the circuit board PB (see FIG. 1B) is bonded. The first pad region PA1 may include a first region B1 in which the first pads PD1 are disposed, and a second region B2 in which the second pads PD2 are disposed. The first pad region PA1 and the second pad region PA2 may be disposed in the non-display region DP-NDA. Some of the first pads PD1 may be connected to corresponding data lines DL, respectively.

The first pad region PA1 and the second pad region PA2 may be spaced apart from each other in the second direction DR2. The second pads PD2 and the third pads PD3 may be connected to each other through connection signal lines S-CL. In the first region B1, two pad columns are illustrated as an example. However, embodiments are not limited thereto, and more pad columns may be disposed. The third pads PD3 may be bonded to circuit pads PB-PD of a circuit board PB. A bonding structure of the third pads PD3 and the circuit pads PB-PD of the circuit board PB may be the same as or different from a bonding structure of the first pads PD1 or second pads PD2 and bumps of a driving chip DC, which will be described below.

Pads connected to first signal lines SL1 and second signal lines SL2, which will be described below, may be also disposed in the first region B1. In an embodiment, the pads connected to the first signal lines SL1 and the second signal lines SL2 may be disposed in the second pad region PA2.

Figure 4:
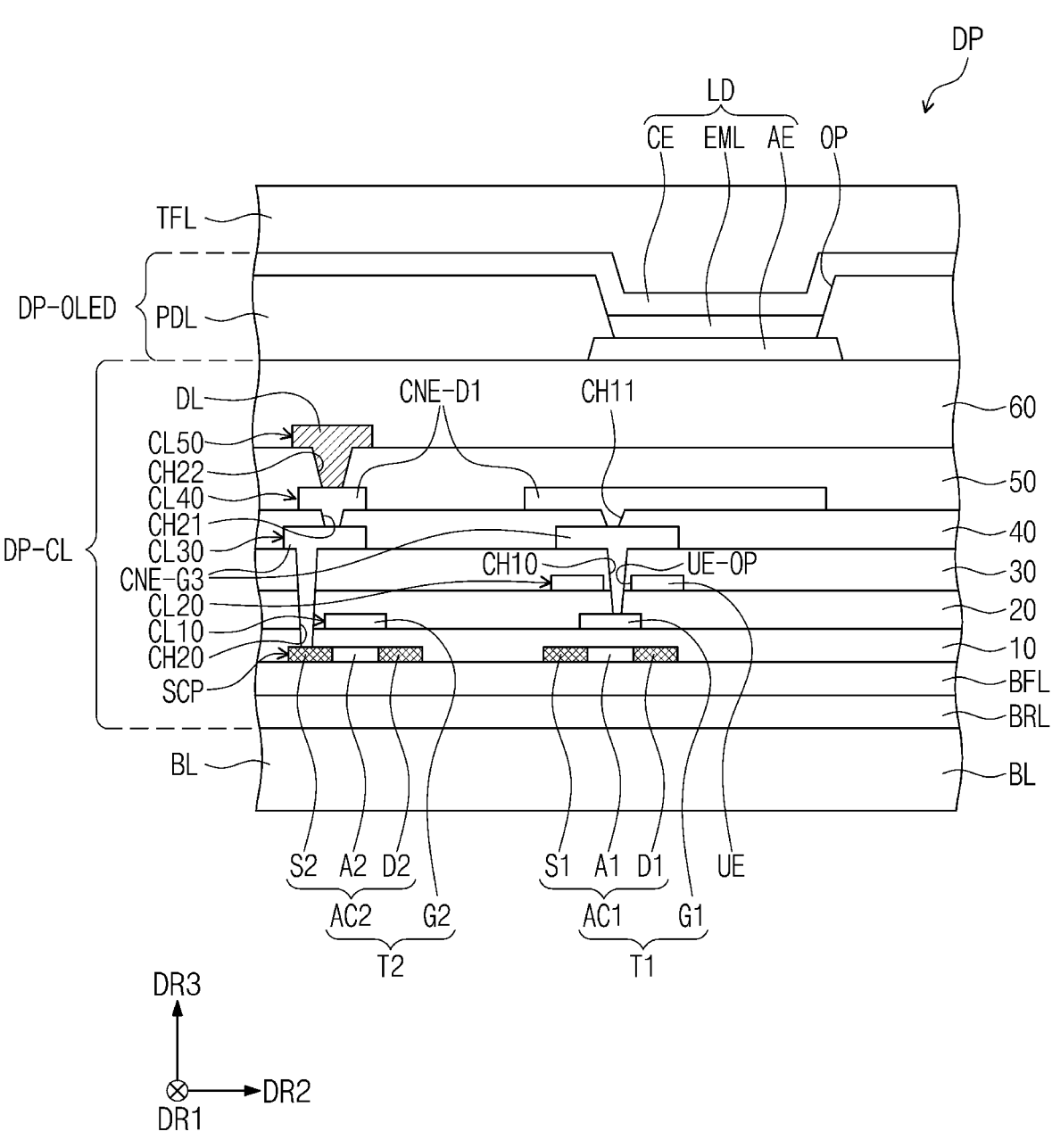
FIG. 4 is a schematic cross-sectional view of a display panel according to an embodiment.

FIG. 4 is a schematic cross-sectional view of a display panel DP according to an embodiment.

Referring to FIG. 4, the display panel DP may include a base layer BL, and a driving element layer DP-CL, a display element layer DP-OLED, and an upper insulation layer TFL that are disposed on the base layer BL. First and second transistors T1 and T2 are illustrated as an example of a driving circuit of a pixel.

A plurality of insulation layers may be disposed on a top surface (or upper surface) of the base layer BL. The plurality of insulation layers may include a barrier layer BRL and a buffer layer BFL. The plurality of insulation layers may further include a first insulation layer 10 to a sixth insulation layer 60. The barrier layer BRL may prevent foreign matters from being introduced (or permeated) from the outside. The barrier layer BRL may include a silicon oxide layer and a silicon nitride layer. Each of the silicon oxide layer and the silicon nitride layer may be provided in plurality, and the silicon oxide layers and the silicon nitride layers may be stacked alternately.

The buffer layer BFL may improve a bonding force between the base layer BL and a semiconductor pattern and/or a conductive pattern layer. The buffer layer BFL may include a silicon oxide layer and a silicon nitride layer. The silicon oxide layer and the silicon nitride layer may be stacked alternately.

A semiconductor pattern SCP may be disposed on the buffer layer BFL. The semiconductor pattern may include an amorphous or crystalline silicon semiconductor or a metal oxide semiconductor. As illustrated in FIG. 4, the semiconductor pattern SCP may include a first semiconductor region AC1 and a second semiconductor region AC2. The first semiconductor region AC1 may include a source region S1, a channel region A1, and a drain region D1 of the first transistor T1, and the second semiconductor region AC2 may include a source region S2, a channel region A2, and a drain region D2 of the second transistor T2. In an embodiment, the first and second transistors T1 and T2 may include different semiconductors. The second transistor T2 may include a different material and be disposed on a different layer from the first semiconductor region AC1.

The first insulation layer 10 may be disposed on the buffer layer BFL. The first insulation layer 10 may cover the semiconductor pattern SCP. The first insulation layer 10 may be an inorganic layer, but embodiments are not limited thereto. A first conductive layer CLIO may be disposed on the first insulation layer 10. The first conductive layer CLIO may include a plurality of conductive pattern layers. The first conductive layer CLIO may include a gate G1 of the first transistor T1 and a gate G2 of the second transistor T2. The first conductive layer CLIO may include molybdenum (Mo), a molybdenum-containing alloy, titanium (Ti), a titanium-containing alloy, or the like, which has good heat resistance, but embodiments are not limited thereto. The first conductive layer CLIO may have a single-layer structure or a multilayer structure.

The second insulation layer 20 that covers the first conductive layer CLIO may be disposed on the first insulation layer 10. The second insulation layer 20 may be an inorganic layer, but embodiments are not limited thereto. A second conductive layer CL20 may be disposed on the second insulation layer 20. The second conductive layer CL20 may include a plurality of conductive pattern layers. The second conductive layer CL20 may include an upper electrode UE. The upper electrode UE may overlap the gate G1 of the first transistor T1, and an opening portion UE-OP may be defined therein. A capacitor may be defined by the upper electrode UE and the gate G1 of the first transistor T1 that overlap each other.

The third insulation layer 30 that covers the second conductive layer CL20 may be disposed on the second insulation layer 20. The third insulation layer 30 may be an inorganic layer, but embodiments are not limited thereto. A third conductive layer CL30 may be disposed on the third insulation layer 30. The third conductive layer CL30 may include a plurality of conductive pattern layers. The third conductive layer CL30 may include connection electrodes CNE-G3. A connection electrode CNE-G3 may be connected to the gate G1 of the first transistor T1 through a contact hole CH10 passing through the second insulation layer 20 and the third insulation layer 30. The contact hole CH10 may pass through the opening portion UE-OP. The other connection electrode CNE-G3 may be connected to the source region S2 of the second transistor T2 through a contact hole CH20 passing through the first insulation layer 10, the second insulation layer 20, and the third insulation layer 30. The third conductive layer CL30 may further include a plurality of connection electrodes.

The fourth insulation layer 40 that covers the third conductive layer CL30 may be disposed on the third insulation layer 30. The fourth insulation layer 40 may be an inorganic layer, but embodiments are not limited thereto. A fourth conductive layer CL40 may be disposed on the fourth insulation layer 40. The fourth conductive layer CL40 may include a plurality of conductive pattern layers. The fourth conductive layer CL40 may include connection electrodes CNE-D1. The connection electrodes CNE-D1 may be connected to corresponding connection electrodes CNE-G3 through contact holes CH11 and CH21, respectively, which pass through the fourth insulation layer 40.

The fifth insulation layer 50 that covers the fourth conductive layer CL40 may be disposed on the fourth insulation layer 40. The fifth insulation layer 50 may be an organic layer, but embodiments are not limited thereto. A fifth conductive layer CL50 may be disposed on the fifth insulation layer 50. The fifth conductive layer CL50 may include a plurality of conductive pattern layers. The fifth conductive layer CL50 may include a data line DL. The data line DL may be connected to a corresponding connection electrode CNE-D1 through a contact hole CH22 passing through the fifth insulation layer 50. The fifth conductive layer CL50 may further include a connection electrode.

The sixth insulation layer 60 that covers the fifth conductive layer CL50 may be disposed on the fifth insulation layer 50. The sixth insulation layer 60 may be an organic layer, but embodiments are not limited thereto. A light emitting element LD may be disposed on the sixth insulation layer 60. A first electrode AE of the light emitting element LD may be disposed on the sixth insulation layer 60. The first electrode AE may be an anode. A pixel defining film PDL may be disposed on the sixth insulation layer 60.

At least a portion of the first electrode AE may be exposed by an opening portion OP of the pixel defining film PDL. The opening portion OP of the pixel defining film PDL may define (or form) a light emitting region. A light emitting layer EML may be disposed on the first electrode AE. In an embodiment, the light emitting layer EML patterned is illustrated as an example, but the light emitting layer EML may be disposed, in common, in the plurality of pixels PX (see FIG. 3). The light emitting layer EML disposed in common may generate white light or blue light. The light emitting layer EML may have a multilayer structure.

For example, a hole transport layer may be further disposed between the first electrode AE and the light emitting layer EML. A hole injection layer may be further disposed between the hole transport layer and the first electrode AE. The hole transport layer or the hole injection layer may be disposed, in common, in the plurality of pixels PX (see FIG. 3).

A second electrode CE may be disposed on the light emitting layer EML. For example, an electron transport layer may be further disposed between the second electrode CE and the light emitting layer EML. An electron injection layer may be further disposed between the electron transport layer and the second electrode CE. The electron transport layer or the electron injection layer may be disposed, in common, in the plurality of pixels PX (see FIG. 3).

Figure 5A:
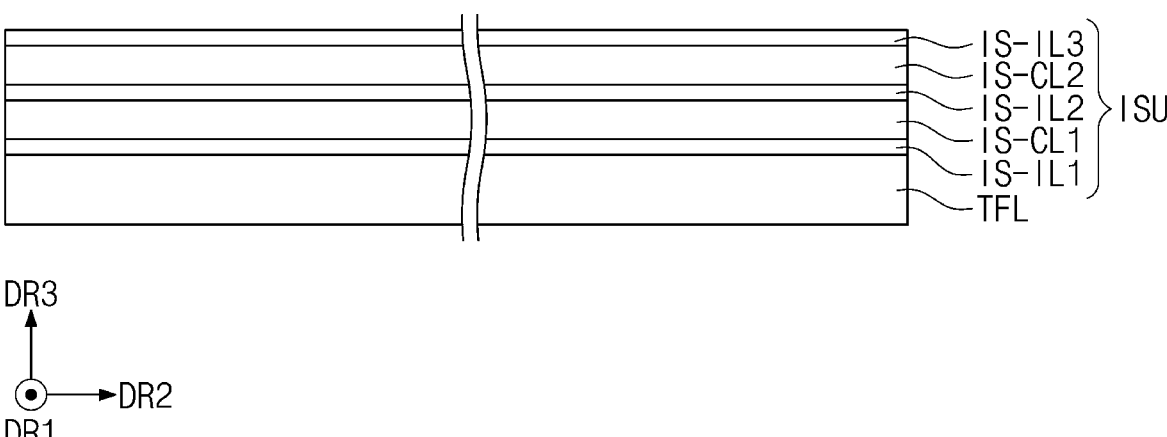
FIG. 5A is a schematic cross-sectional view of an input sensor according to an embodiment.
Figure 5B:
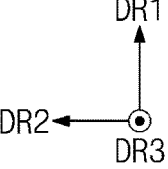
FIG. 5B is a schematic plan view of an input sensor according to an embodiment.
Figure 5C:
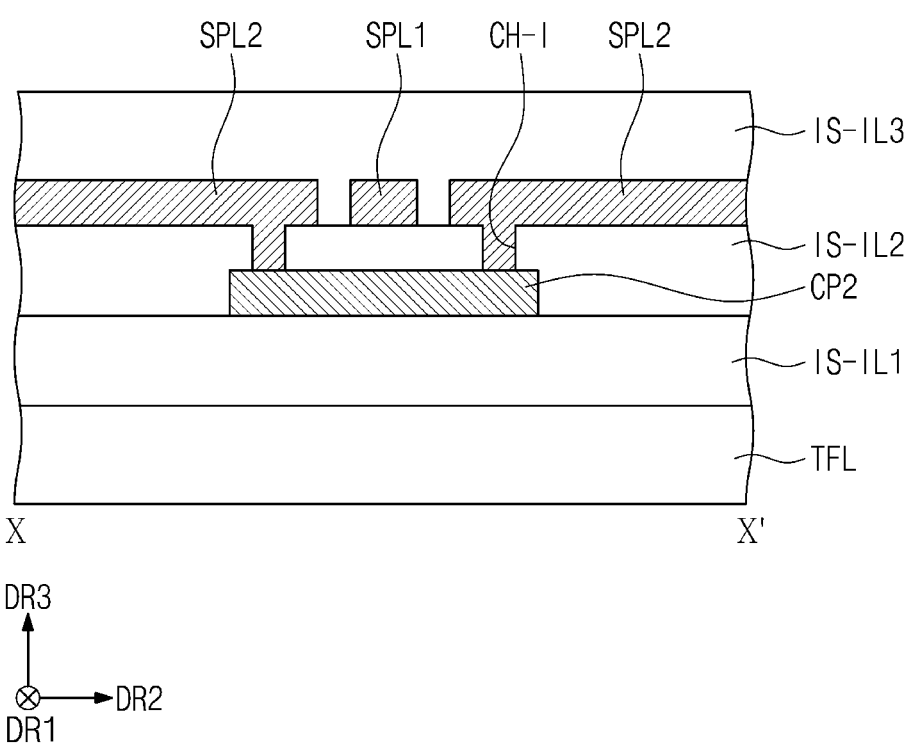
FIG. 5C is a schematic cross-sectional view corresponding to line X-X' in FIG. 5B.

FIG. 5A is a schematic cross-sectional view of an input sensor ISU according to an embodiment. FIG. 5B is a schematic plan view of an input sensor ISU according to an embodiment. FIG. 5C is a schematic cross-sectional view of a bridge pattern layer of an input sensor ISU according to an embodiment.

The input sensor ISU may include a first insulation layer IS-IL1 (hereinafter referred to as a first sensor insulation layer), a first sensor conductive pattern layer IS-CL1, a second insulation layer IS-IL2 (hereinafter referred to as a second sensor insulation layer), a second sensor conductive pattern layer IS-CL2, and a third insulation layer IS-IL3 (hereinafter referred to as a third sensor insulation layer). The first sensor insulation layer IS-IL1 may be disposed (e.g., directly disposed) on an upper insulation layer TFL.

In an embodiment, the first sensor insulation layer IS-IL1 and/or the third sensor insulation layer IS-IL3 may be omitted. In case that the first sensor insulation layer IS-IL1 is omitted, the first sensor conductive pattern layer IS-CL1 may be disposed on the uppermost insulation layer of the upper insulation layer TFL. The third sensor insulation layer IS-IL3 may be replaced with an adhesive layer or an insulation layer of an anti-reflection member disposed on the input sensor ISU.

The first sensor conductive pattern layer IS-CL1 may include first conductive pattern layers, and the second sensor conductive pattern layer IS-CL2 may include second conductive pattern layers. The first sensor conductive pattern layer IS-CL1 and the second sensor conductive pattern layer IS-CL2 may each have a single-layer structure, or a multi-layer structure in which layers are stacked along the third direction DR3. The conductive pattern layers having a multilayer structure may each include at least two of transparent conductive layers and metal layers. The conductive pattern layer having a multilayer structure may include metal layers including different metals. The transparent conductive layers may include an indium tin oxide (ITO), an indium zinc oxide (IZO), a zinc oxide (ZnO), an indium tin zinc oxide (ITZO), PEDOT, a metal nanowire, and graphene. The metal layers may include molybdenum, silver, titanium, copper, aluminum, and an alloy thereof. A stacked structure of each of the first sensor conductive pattern layer IS-CL1 and the second sensor conductive pattern layer IS-CL2 will be described below.

In an embodiment, the first sensor insulation layer IS-IL1 to the third sensor insulation layer IS-IL3 may each include an inorganic layer or an organic layer. In an embodiment, the first sensor insulation layer IS-IL1 to the third sensor insulation layer IS-IL3 may each include an inorganic layer. The inorganic layer may include a silicon oxide, a silicon nitride, or a silicon oxynitride.

In an embodiment, at least one of the first sensor insulation layer IS-IL1 to the third sensor insulation layer IS-IL3 may be an organic layer. For example, the third sensor insulation layer IS-IL3 may include an organic layer. The organic layer may include at least one of an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

Referring to FIG. 5B, the input sensor ISU may include a sensing region IS-DA and a non-sensing region IS-NDA adjacent to the sensing region IS-DA. The sensing region IS-DA and the non-sensing region IS-NDA may correspond to the display region DP-DA and the non-display region DP-NDA, respectively, which are illustrated in FIG. 2.

The input sensor ISU may include a plurality of sensing electrodes disposed in the sensing region IS-DA. The sensing electrodes may include first sensing electrodes E1-1 to E1-5 (hereinafter referred to as first electrodes) and second sensing electrodes E2-1 to E2-4 (hereinafter referred to as second electrodes), which are insulated from and intersect with each other. The input sensor ISU may include first signal lines SL1 and second signal lines SL2, which are disposed in the non-sensing region IS-NDA and which are electrically connected to the first electrodes E1-1 to E1-5 and the second electrodes E2-1 to E2-4, respectively. The first electrodes E1-1 to E1-5, the second electrodes E2-1 to E2-4, the first signal lines SL1, and the second signal lines SL2 may be defined by a combination of the conductive pattern layers of the first sensor conductive pattern layer IS-CL1 and the second sensor conductive pattern layer IS-CL2 that are described with reference to FIG. 5A. FIG. 5B illustrates that the first signal lines SL1 and the second signal lines SL2 each have a shape of a single body. However, embodiments are not limited thereto. The first signal lines SL1 and the second signal lines SL2 may each include a plurality of portions disposed on different layers.

The first electrodes E1-1 to E1-5 and the second electrodes E2-1 to E2-4 may each include a plurality of conductive lines that intersect with each other. The plurality of conductive lines may define a plurality of opening portions, and the first electrodes E1-1 to E1-5 and the second electrodes E2-1 to E2-4 may each have a mesh shape. Each of the plurality of opening portions may be defined to correspond to the opening OP of the pixel defining film PDL illustrated in FIG. 4.

One of the first electrodes E1-1 to E1-5 and the second electrodes E2-1 to E2-4 may have a shape of a single body. In an embodiment, the first electrodes E1-1 to E1-5 having a shape of a single body is illustrated as an example. The first electrodes E1-1 to E1-5 may include sensing portions SPL1 and intermediate portions CP1. Some of the conductive pattern layers of the second sensor conductive pattern layer IS-CL2 described above may correspond to the first electrodes E1-1 to E1-5.

The second electrodes E2-1 to E2-4 may each include sensing pattern layers SPL2 and bridge pattern layers CP2 (or connection pattern layers). As illustrated in FIGS. 5B and 5C, two adjacent sensing pattern layers SPL2 may be connected to two bridge pattern layers CP2 through contact holes CH-I passing through the second sensor insulation layer IS-IL2. However, the number of the bridge pattern layers is not limited. Some of the conductive pattern layers of the second sensor conductive pattern layer IS-CL2 described above may correspond to the sensing pattern layers SPL2. Seme of the conductive pattern layers of the first sensor conductive pattern layer IS-CL1 described above may correspond to the bridge pattern layers CP2.

In an embodiment, the bridge pattern layers CP2 are described as being formed from the first sensor conductive pattern layer IS-CL1 illustrated in FIG. 5A, and the first electrodes E1-1 to E1-5 and the sensing pattern layers SPL2 are described as being formed from the second sensor conductive pattern layer IS-CL2. However, embodiments are not limited thereto. The first electrodes E1-1 to E1-5 and the sensing pattern layers SPL2 may be formed from the first sensor conductive pattern layer IS-CL1 illustrated in FIG. 5A, and the bridge pattern layers CP2 may be formed from the second sensor conductive pattern layer IS-CL2.

One of the first signal lines SL1 and the second signal lines SL2 may transmit a transmission signal for sensing an external input from an external circuit to a corresponding electrode among the first electrodes E1-1 to E1-5 and the second electrodes E2-1 to E2-4, and another thereof may transmit, as a reception signal, a variation in capacitance between the first electrodes E1-1 to E1-5 and the second electrodes E2-1 to E2-4 to the external circuit.

Some of the conductive pattern layers of the second sensor conductive pattern layer IS-CL2 described above may correspond to the first signal lines SL1 and the second signal lines SL2. The first signal lines SL1 and the second signal lines SL2 may have a multilayer structure and may include a first-layer line formed from the first sensor conductive pattern layer IS-CL1 describe above and a second-layer line formed from the second sensor conductive pattern layer IS-CL2 describe above. The first-layer line and the second-layer line may be connected to each other through a contact hole passing through the second sensor insulation layer IS-IL2 (see FIG. 5A).

Figure 6:
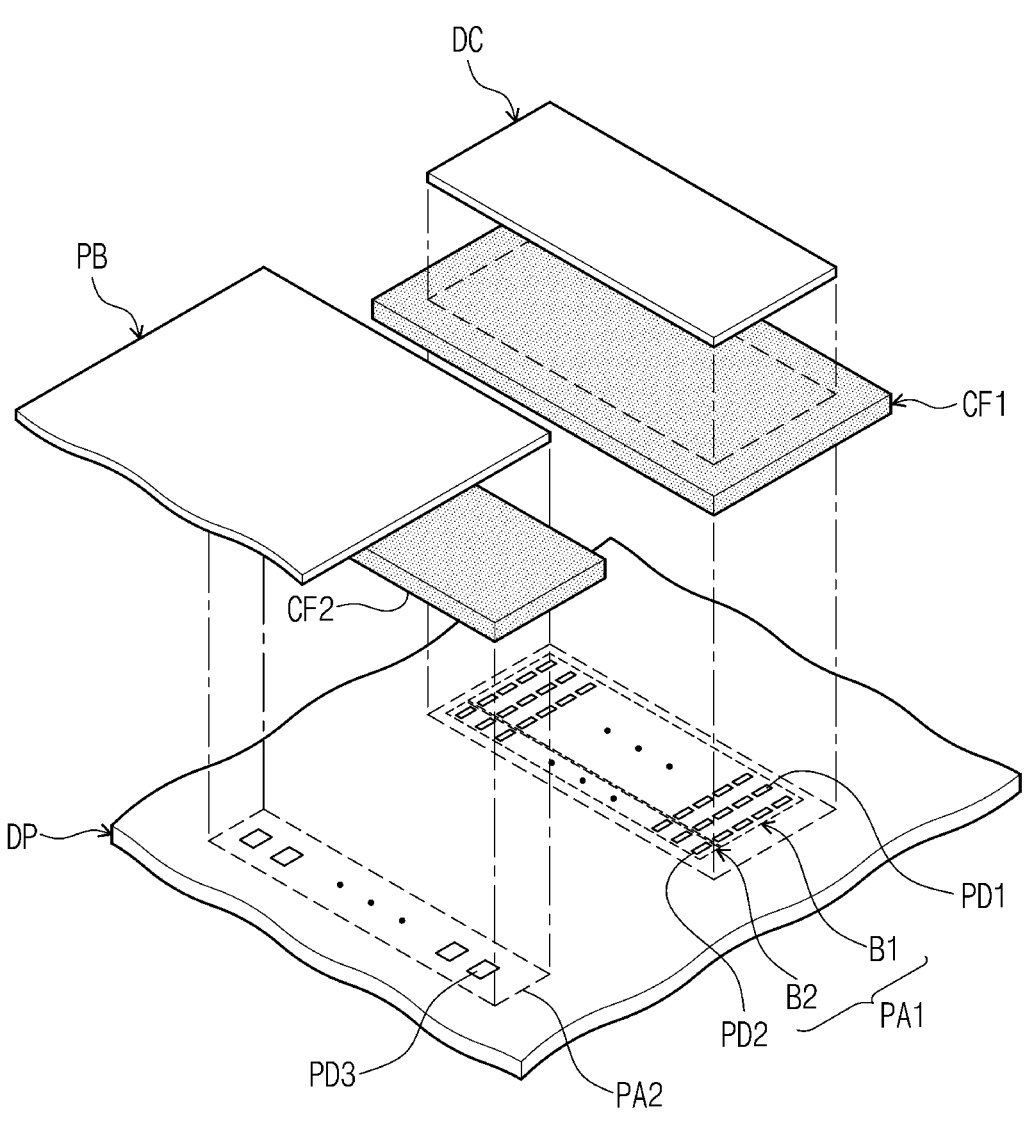
FIG. 6 is an exploded perspective view of a pad region of a display device according to an embodiment.

FIG. 6 is an exploded perspective view of pad regions PA1 and PA2 of a display device according to an embodiment.

As illustrated in FIG. 6, a driving chip DC may be bonded to a first pad region PA1 through a first adhesive layer CF1, and a circuit board PB may be bonded to a second pad region PA2 through a second adhesive layer CF2. A bonding process may include the step of aligning the driving chip DC, the first adhesive layer CF1, and the first pad region PA1, the step of pressing the driving chip DC by a head, and the step of curing the first adhesive layer CF1.

According to an embodiment, each of the first adhesive layer CF1 and the second adhesive layer CF2 may not include a conductive ball, and may include a synthetic resin having an adhesive property. The first adhesive layer CF1 and the second adhesive layer CF2, which do not need to maintain arrangement of the conductive ball, may each include a synthetic resin having a relatively low viscosity.

For example, the driving chip DC may include first bumps electrically connected to first pads PD1, respectively, and second bumps electrically connected to second pads PD2, respectively. The driving chip DC may receive first signals from the outside through the second pads PD2 and the second bumps. The driving chip DC may provide the first pads PD1 with second signals, which are generated based on the first signals, through the first bumps. For example, the driving chip DC may include a data driving circuit. The first signals may be image signals that are digital signals applied from the outside, and the second signals may be data signals that are analog signals. The driving chip DC may generate analog voltages corresponding to grayscale values of the image signals. The pixels PX may be provided with the data signals through the data line DL illustrated in FIG. 3.

The circuit board PB may include signal pads electrically connected to third pads PD3, respectively. The circuit board PB may provide the driving chip DC with the image signals, driving voltages, and other control signals.

Figure 7A:
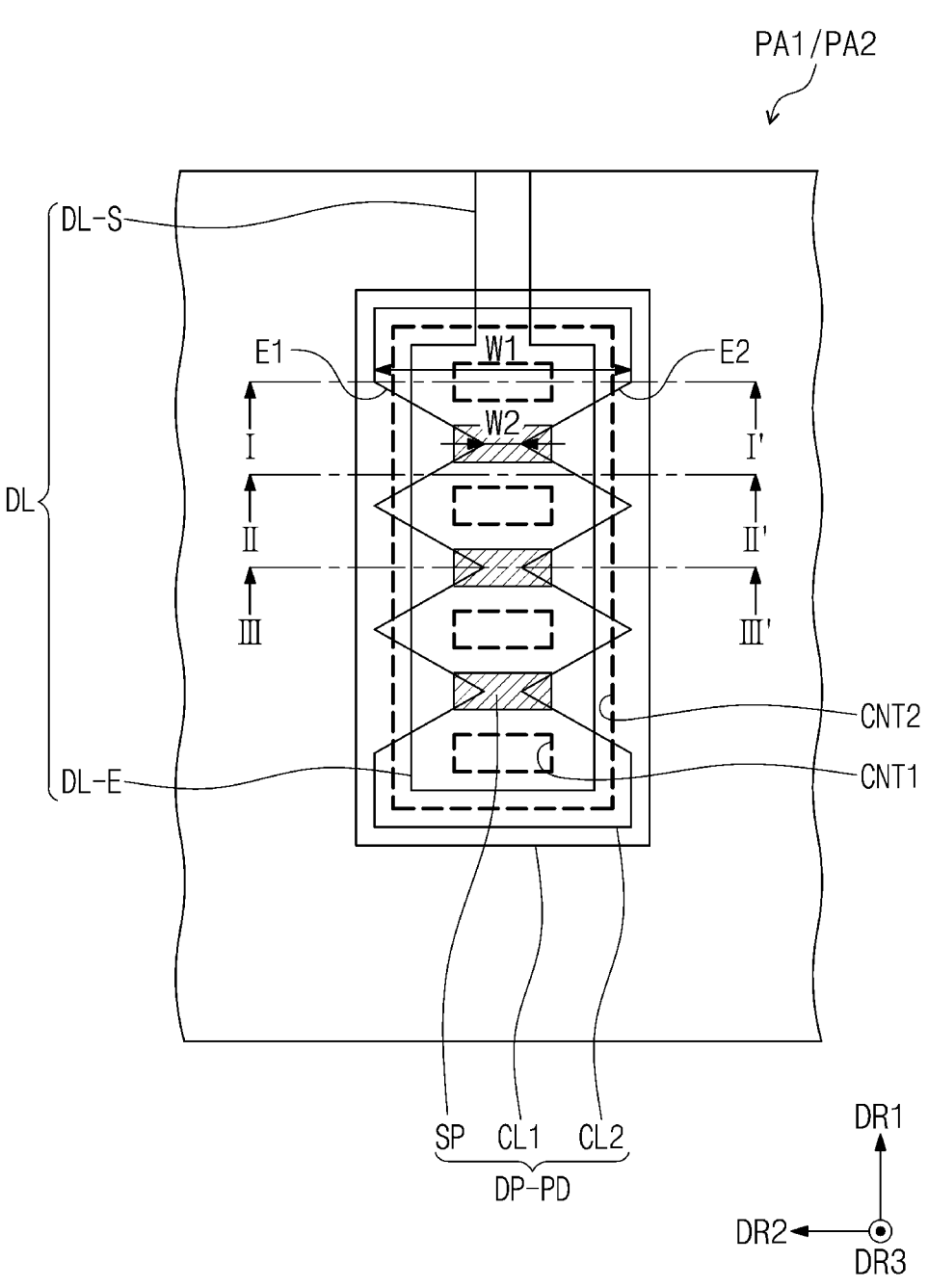
FIG. 7A is a schematic plan view of a pad region according to an embodiment.
Figure 7B:
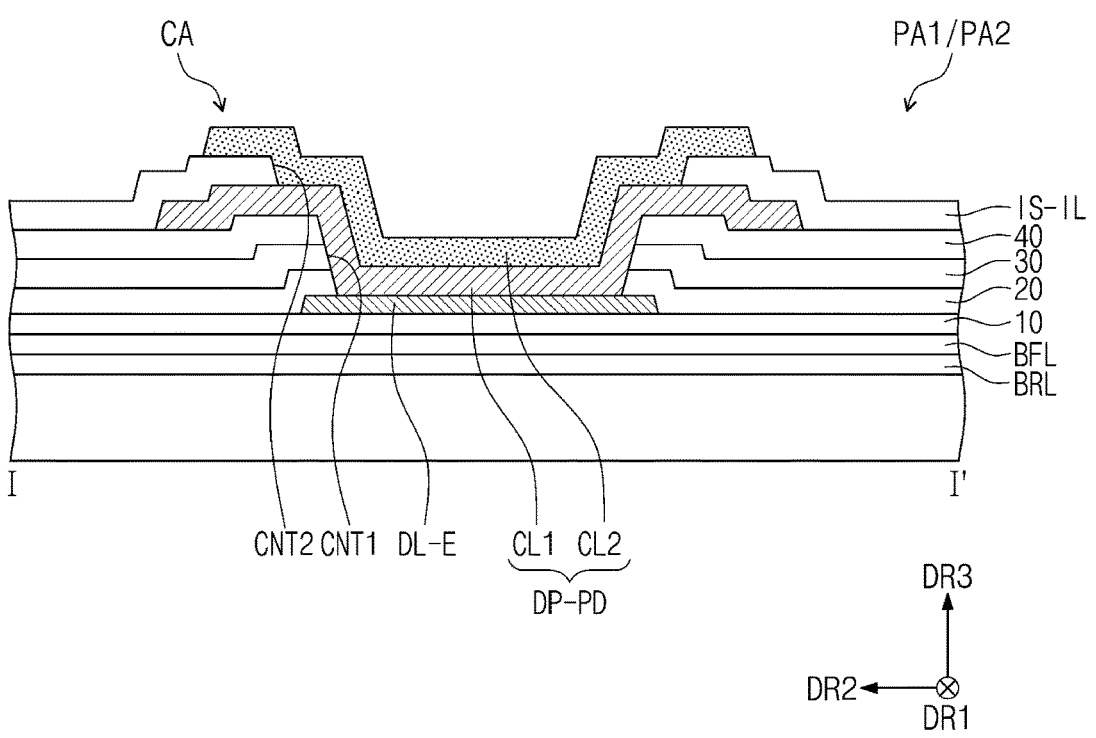
FIGS. 7B to 7D are schematic cross-sectional views corresponding to FIG. 7A.
Figure 7C:
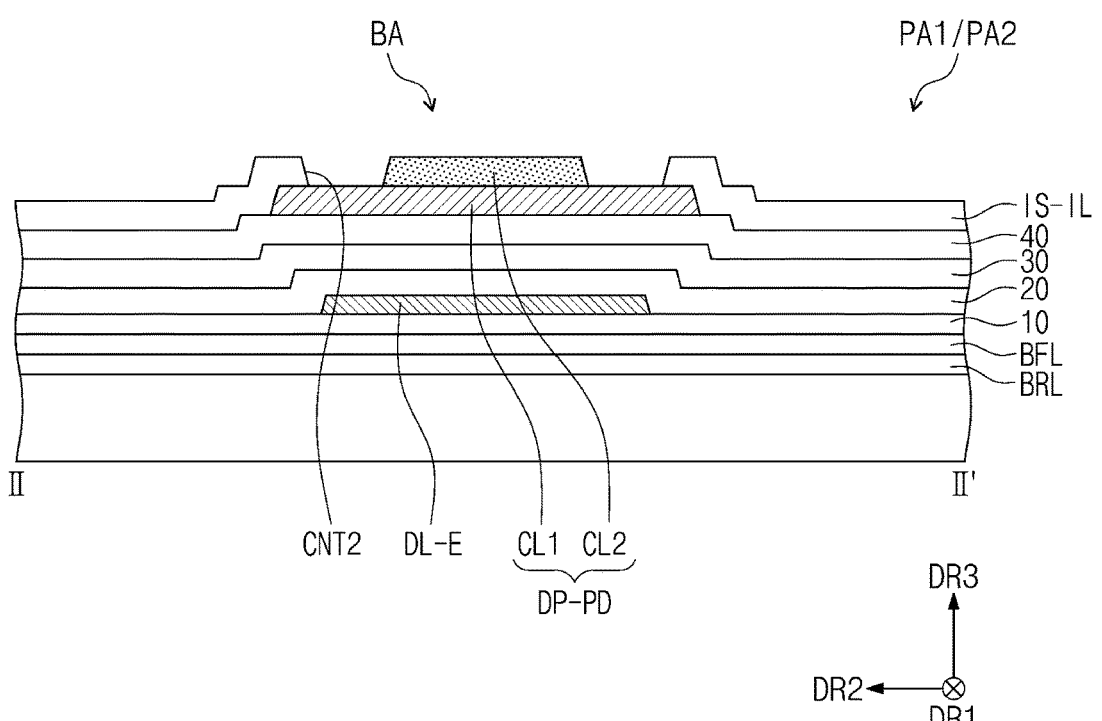
Figure 7D:
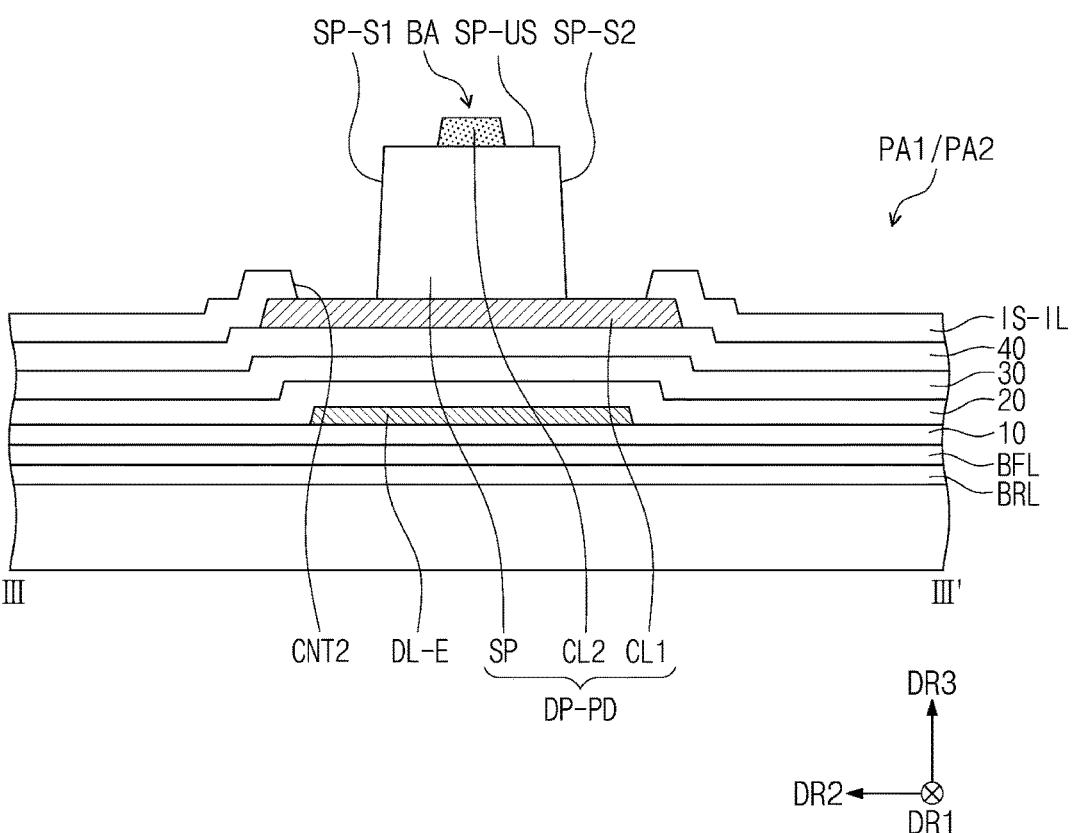
Figure 7E:
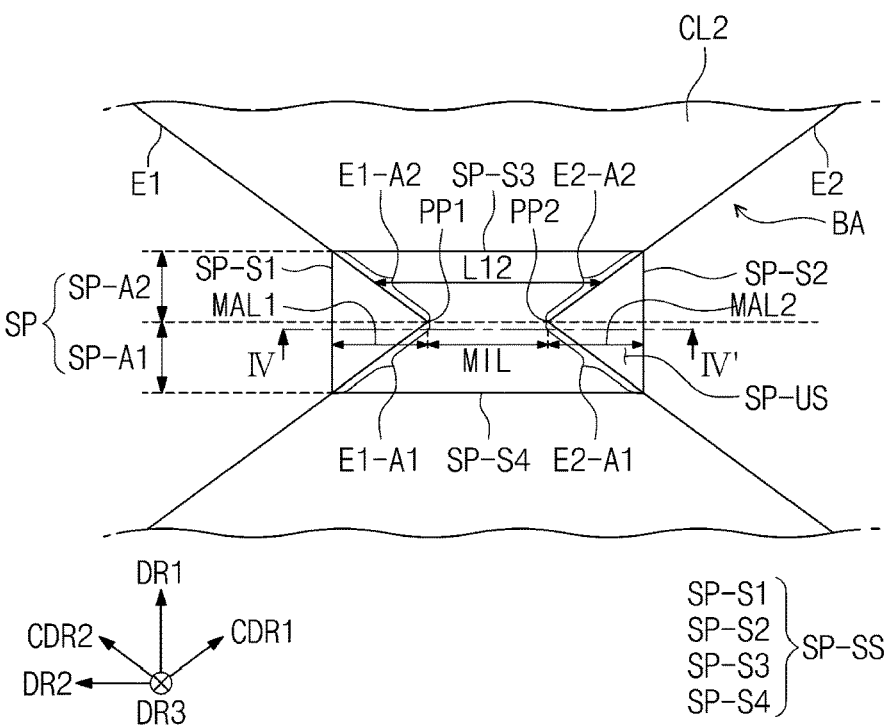
FIG. 7E is an enlarged plan view of a portion in FIG. 7A.
Figure 7F:
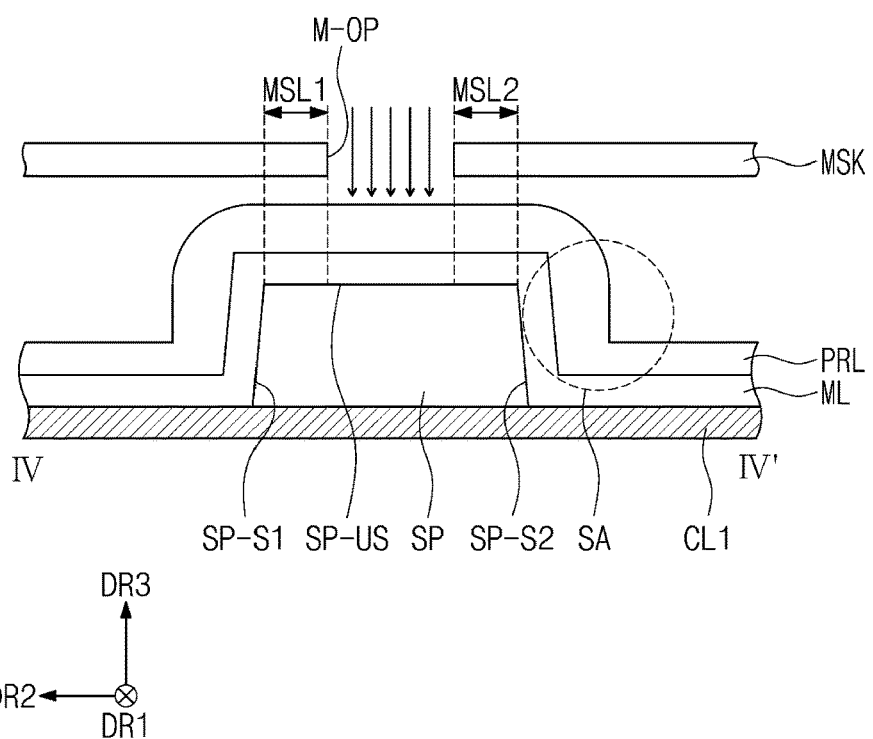
FIGS. 7F to 7H are schematic cross-sectional views illustrating a pad region manufacturing process.
Figure 7G:
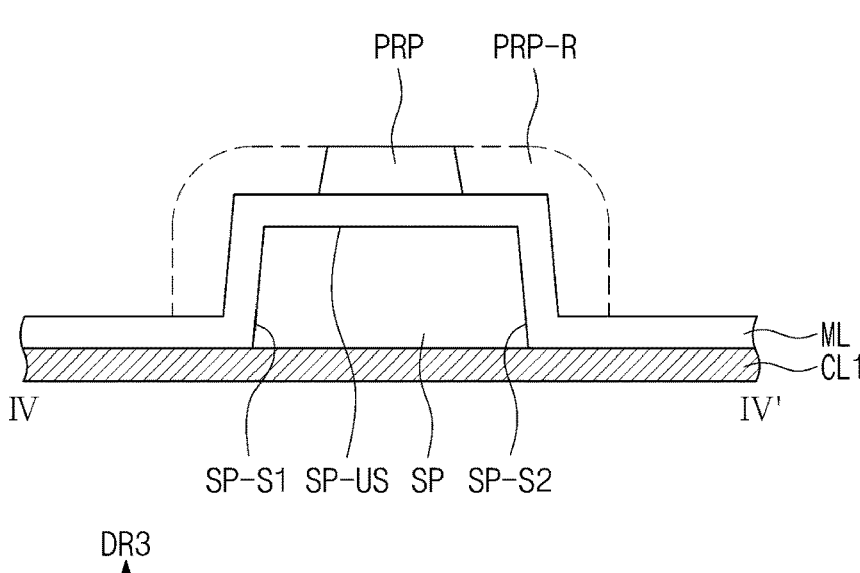
Figure 7H:
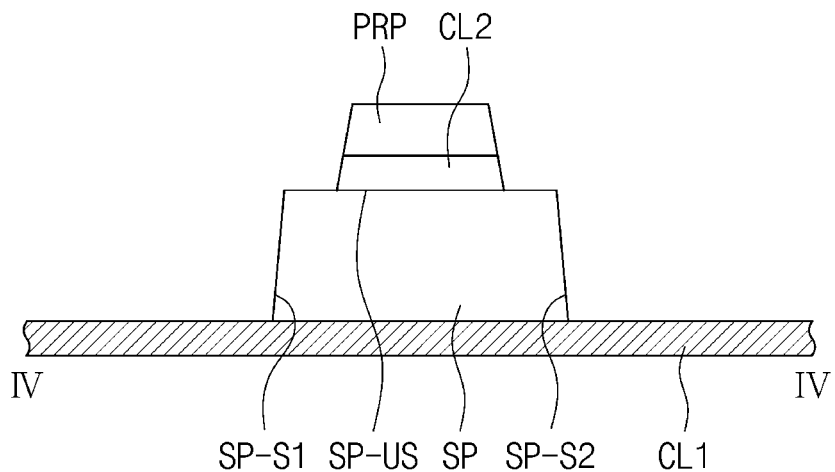
Figure 7H:
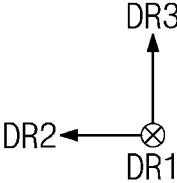
Figure 8:
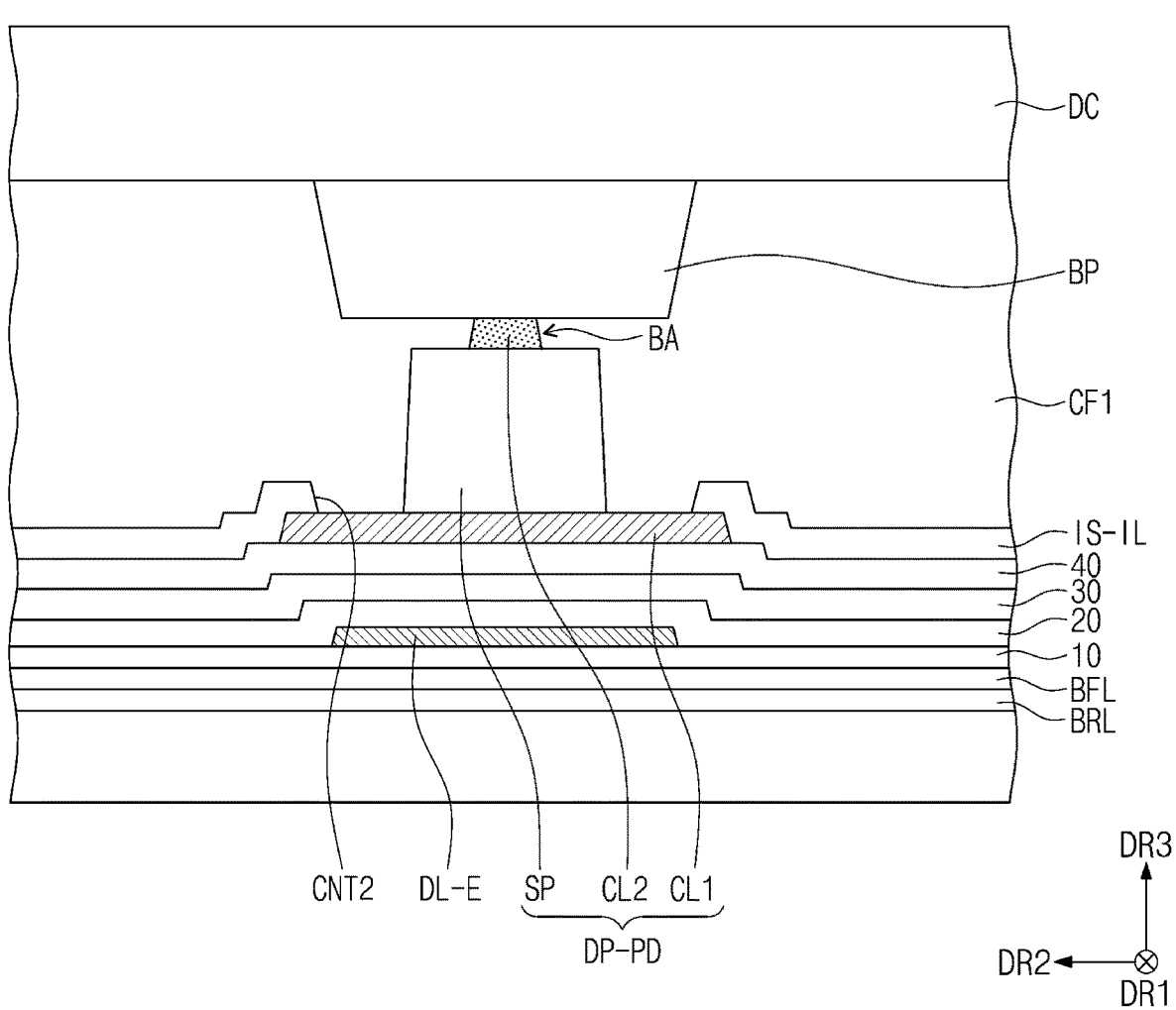
FIG. 8 is a schematic cross-sectional view illustrating a bonding structure of an electronic device according to an embodiment.

FIG. 7A is a schematic plan view of pad regions PA1 and PA2 according to an embodiment. FIGS. 7B, 7C, and 7D are schematic cross-sectional views corresponding to FIG. 7A. FIG. 7E is an enlarged plan view of a portion in FIG. 7A. FIGS. 7F, 7G, and 7H are schematic cross-sectional views illustrating a process of manufacturing pad regions PA1 and PA2. FIG. 8 is a schematic cross-sectional view illustrating a bonding structure of an electronic device according to an embodiment.

A signal pad DP-PD illustrated in FIG. 7A may be one of the first to third pads PD1 to PD3 described with reference to FIG. 6. FIG. 7A illustrates, as an example of a signal line, a data line DL including an end portion DL-E and a line portion DL-S that are different in width. However, embodiments are not limited thereto. The signal line may be a signal line other than the data line DL, and the end portion DL-E and the line portion DL-S may have the same width.

Hereinafter, the pad regions PA1 and PA2 will be described with a focus on a first pad region PA1 in which the data line DL is disposed. The description of the first pad region PA1 applies to a second pad region PA2 except that, in the second pad region PA2, the connection signal line S-CL (see FIG. 3) is disposed instead of the data line DL.

Referring to FIG. 7A, the signal pad DP-PD may include a first conductive pattern layer CL1 connected to the data line DL through at least one first contact hole CNT1, a second conductive pattern layer CL2 connected to the first conductive pattern layer CL1 through at least one second contact hole CNT2, and at least one insulation pattern layer SP overlapping the second conductive pattern layer CL2 in a plan view. FIG. 7A illustrates, as an example, four first contact holes CNT1 and three insulation pattern layers SP. Each of the three insulation pattern layers SP may be disposed between the four first contact holes CNT1. The insulation pattern layers SP may be arranged with the first contact holes CNT1 in the first direction DR1. Each of the insulation pattern layers SP may be disposed between two adjacent contact holes CNT1 among the first contact holes CNT1.

The insulation pattern layer SP may include a polymer. The insulation pattern layer SP may include a thermoset polymer. However, embodiments are not limited thereto, and the insulation pattern layer SP may also include a thermoplastic polymer.

The first contact holes CNT1 may overlap the end portion DL-E in a plan view. The insulation pattern layers SP may be disposed outside the first contact holes CNT1 and disposed inside the second contact hole CNT2 in a plan view. The first contact holes CNT1 may be disposed inside the second contact hole CNT2 in a plan view.

The end portion DL-E may have a shape extending in the first direction DR1. For example, the end portion DL-E may have a length in the first direction DR1, which is greater than a width in the second direction DR2. The insulation pattern layers SP may be arranged along the first direction DR1. The insulation pattern layers SP may be disposed apart from each other in the first direction DR1.

The insulation pattern layers SP may each have a shape extending in the second direction DR2 intersecting the first direction DR1 in which the insulation pattern layers SP are disposed. The insulation pattern layers SP may each have a quadrangular shape extending in the second direction DR2 in a plan view. However, embodiments are not limited thereto, and the shape of each of the insulation pattern layers SP may be changed into an oval shape or a polygonal shape other than the quadrangular shape, which extends in the second direction DR2. The shapes of the insulation pattern layers SP may be the same as each other, but embodiments are not limited thereto. The shapes of the insulation pattern layers SP in a plan view will be described in detail below.

Referring to FIGS. 7A to 7D, the end portion DL-E may be disposed on a first insulation layer 10. The end portion DL-E may be disposed on the same layer as the gates G1 and G2 illustrated in FIG. 4. The end portion DL-E and the gates G1 and G2 may be formed by the same process.

However, the position of the end portion DL-E in a cross-sectional view is not limited thereto. The end portion DL-E may also be disposed on the same layer, include the same material, and have the same stacked structure as the upper electrode UE or the connection electrodes CNE-G3 of the third conductive layer CL30, illustrated in FIG. 4.

However, all of the end portions DL-E of a plurality of data lines DL are not limited to being disposed on the same layer. In the plurality of data lines DL illustrated in FIG. 3, the end portions DL-E of some data lines and the gates G1 and G2 may be formed by the same process, and the end portions DL-E of other data lines and the upper electrode UE or the connection electrodes CNE-G3 of the third conductive layer CL30 may be formed by the same process.

The end portion DL-E, the first conductive pattern layer CL1, and the second conductive pattern layer CL2, which are illustrated in FIG. 7B, may include a conductive layer having a single-layer structure or a multilayer structure. The end portion DL-E, the first conductive pattern layer CL1, and the second conductive pattern layer CL2 may be distinguished according to whether insulation layers 20 to IS-IL are disposed therebetween, or distinguished according to whether to be connected through the contact holes CNT1 and CNT2.

The first conductive pattern layer CL1 may be disposed on the end portion DL-E and a fourth insulation layer 40. The first conductive pattern layer CL1 may be connected to the end portion DL-E through a first contact hole CNT1 passing through the second insulation layer 20 to the fourth insulation layer 40. The second insulation layer 20 to the fourth insulation layer 40 of the first or second pad region PA1 or PA2 may be formed by the same process as the second insulation layer 20 to the fourth insulation layer 40 of the display region DP-DA illustrated in FIG. 4. The area of the first contact hole CNT1 may determine a contact area between the first conductive pattern layer CL1 and the end portion DL-E. The first conductive pattern layer CL1 may include connection regions CA (or first regions) overlapping the first contact hole CNT1.

The first conductive pattern layer CL1 and the end portion DL-E may be distinguished from each other by the second insulation layer 20 to the fourth insulation layer 40 that are disposed outside the first contact hole CNT1 and disposed below the first conductive pattern layer CL1 or disposed between the first conductive pattern layer CL1 and the end portion DL-E. In an embodiment, the second insulation layer 20 to the fourth insulation layer 40 may be defined as a first group of insulation layers. A stacked structure of the first group of insulation layers may change. In an embodiment, the first contact hole CNT1 may pass through more insulation layers than the second insulation layer 20 to the fourth insulation layer 40.

The first conductive pattern layer CL1 may have a single-layer structure or a multilayer structure. The first conductive pattern layer CL1 may include at least one of a first layer, which is formed by the same process as the fourth conductive layer CL40 in FIG. 4, or a second layer formed by the same process as the fifth conductive layer CL50 in FIG. 4. The insulation layer may not be disposed between the first layer and the second layer.

Referring to FIG. 7B, the fifth insulation layer 50 and the sixth insulation layer 60 that are illustrated in FIG. 4 may not be disposed in the pad regions PA1 and PA2. The first group of insulation layers may include at least one of the fifth insulation layer 50 or the sixth insulation layer 60. In another example, the first conductive pattern layer CL1 may be omitted.

The second conductive pattern layer CL2 may be disposed on a sensor insulation layer IS-IL of an input sensor ISU. The sensor insulation layer IS-IL may include at least one of the first sensor insulation layer IS-IL1 or the second sensor insulation layer IS-IL2 illustrated in FIGS. 5A to 5C. The second conductive pattern layer CL2 may include at least one of the first sensor conductive pattern layer IS-CL1 or the second sensor conductive pattern layer IS-CL2 illustrated in FIGS. 5A to 5C.

In an embodiment, the second conductive pattern layer CL2 may be formed by the same process as the second sensor conductive pattern layer IS-CL2 in FIG. 5A and the sensing pattern layers SPL2 in FIG. 5C. The second conductive pattern layer CL2 is illustrated as having a smaller width or length in the second direction DR2 than the first conductive pattern layer CL1. However, embodiments are not limited thereto.

The second conductive pattern layer CL2 may be connected to the first conductive pattern layer CL1 through the second contact hole CNT2 passing through the sensor insulation layer IS-IL of the input sensor ISU. The sensor insulation layer IS-IL may overlap the sensing region IS-DA and the non-sensing region IS-NDA which are illustrated in FIG. 5A. The sensor insulation layer IS-IL may overlap the pad regions PA1 and PA2. In case that the sensor insulation layer IS-IL does not overlap the pad regions PA1 and PA2, the second contact hole CNT2 may be omitted.

The first conductive layer CL1 and the second conductive pattern layer CL2 may be distinguished from each other by the sensor insulation layer IS-IL that is disposed outside the second contact hole CNT2 and disposed between the first conductive layer CL1 and the second conductive pattern layer CL2. In an embodiment, the sensor insulation layer IS-IL may be defined as a second group of insulation layers IS-IL.

Referring to FIGS. 7A and 7C, a portion of the first conductive pattern layer CL1 non-overlapping the first contact hole CNT1 may be disposed on the fourth insulation layer 40. A portion of the second conductive pattern layer CL2 non-overlapping the first contact hole CNT1 may be disposed on the first conductive pattern layer CL1 and in contact with the first conductive pattern layer CL1 inside the second contact hole CNT2. The first conductive pattern layer CL1 may expose a portion of the second conductive pattern layer CL2 inside the second contact hole CNT2.

As illustrated in FIGS. 7A and 7D, the insulation pattern layer SP may be disposed on the first conductive pattern layer CL1 inside the second contact hole CNT2. Another portion of the second conductive pattern layer CL2 non-overlapping the first contact hole CNT1 may overlap the insulation pattern layer SP. The other portion of the second conductive pattern layer CL2 may be disposed on a top surface (or upper surface) SP-US of the insulation pattern layer SP.

The second conductive pattern layer CL2 may expose a portion of the top surface SP-US of the insulation pattern layer SP. The second conductive pattern layer CL2 may expose (or may not overlap) a first side surface SP-S1 and a second side surface SP-S2 of the insulation pattern layer SP, which face each other in the second direction DR2. The first side surface SP-S1 and the second side surface SP-S2 may be exposed from the second conductive pattern layer CL2 so that, in the boding process described with reference to FIG. 6, deformation of the insulation pattern layer SP may occur by bonding pressure and the insulation pattern layer SP may absorb a part of the bonding pressure. Since the insulation pattern layer SP partially absorbs the bonding pressure applied through the second conductive pattern layer CL2 from below the second conductive pattern layer CL2, an occurrence of cracks in the second conductive pattern layer CL2 may be reduced. For example, the insulation pattern layer SP may be more readily restored to a shape before the bonding process from a shape after the bonding process.

Referring to FIGS. 7A, 7C, and 7D, the second conductive pattern layer CL2 may include a plurality of bottleneck regions (or second regions) BA that do not overlap the first contact holes CNT1. The bottleneck regions BA may be disposed in the insulation pattern layers SP, respectively.

FIG. 7E is an enlarged view illustrating a bottleneck region BA. Referring to FIGS. 7A and 7E, the second conductive pattern layer CL2 may include a first edge portion E1 and a second edge portion E2 that face each other in the second direction DR2. FIG. 7E illustrates that side surfaces SP-SS (e.g., the first side surface SP-S1, the second side surface SP-S2, a third side surface SP-S3, and a fourth side surface SP-S4) of the insulation pattern layer SP are the same as a first top surface edge portion (or first upper surface edge portion), a second top surface edge portion (or second upper surface edge portion), a third top surface edge portion (or third upper surface edge portion), to a fourth top surface edge portion (or fourth upper surface edge portion) of the top surface (or upper surface) SP-US of the insulation pattern layer SP, respectively. Among the first side surface SP-S1 to the fourth side surface SP-S4 and the first top surface edge portion to the fourth top surface edge portion of the top surface SP-US of the insulation pattern layer SP, a corresponding side surface and a corresponding top surface edge portion are denoted as like reference numbers or symbols.

A distance L12 between the first edge portion E1 and the second edge portion E2 on the top surface SP-US of the insulation pattern layer SP may change as moving along the first direction DR1. The top surface SP-US of the insulation pattern layer SP may include a first region SP-A1 in which the distance L12 between the first edge portion E1 and the second edge portion E2 may decrease as moving along the first direction DR1, and a second region SP-A2 in which the distance L12 between the first edge portion E1 and the second edge portion E2 may increase as moving along the first direction DR1. The distance L12 between the first edge portion E1 and the second edge portion E2 may be measured in the second direction DR2 perpendicularly intersecting the first direction DR1.

The distance L12 between the first edge portion E1 and the second edge portion E2 in the bottleneck region BA may be less than a distance between the first edge portion E1 and the second edge portion E2 in the connection region CA described with reference to FIGS. 7A and 7B. For example, a width W2 (see FIG. 7A) of the second conductive pattern layer CL2 in the second direction DR2 in the bottleneck region BA may be smaller than a width W1 (see FIG. 7A) of the second conductive pattern layer CL2 in the second direction DR2 in the connection region CA.

A distance between the first side surface SP-S1 of the insulation pattern layer SP, i.e., the first top surface edge portion SP-S1 of the top surface SP-US of the insulation pattern layer SP, and the first edge portion E1 of the second conductive pattern layer CL2 may change as moving along the first direction DR1 in a plan view. In the first region SP-A1, the distance between the first side surface SP-S1 of the insulation pattern layer SP and the first edge portion E1 of the second conductive pattern layer CL2 may increase as moving along the first direction DR1. In the second region SP-A2, the distance between the first side surface SP-S1 of the insulation pattern layer SP and the first edge portion E1 of the second conductive pattern layer CL2 may decrease as moving along the first direction DR1. In the first region SP-A1, a distance between the second side surface SP-S2 of the insulation pattern layer SP and the second edge portion E2 of the second conductive pattern layer CL2 may increase as moving along the first direction DR1. In the second region SP-A2, the distance between the second side surface SP-S2 of the insulation pattern layer SP and the second edge portion E2 of the second conductive pattern layer CL2 may decrease as moving along the first direction DR1.

An extending direction of the first edge portion E1 may change on the top surface SP-US of the insulation pattern layer SP. For example, the first edge portion E1 may include a plurality of portions that are different in extending direction. In the first region SP-A1, the first edge portion E1 may extend in a first oblique direction CDR1 intersecting the first direction DR1 and the second direction DR2, and, in the second region SP-A2, the first edge portion E1 may extend in a second oblique direction CDR2 intersecting the first direction DR1, the second direction DR2, and the first oblique direction CDR1. A region of the first edge portion E1 extending in the first oblique direction CDR1 may be defined as a first region E1-A1, and a region of the first edge portion E1 extending in the second oblique direction CDR2 may be defined as a second region E1-A2.

An extending direction of the second edge portion E2 may change on the top surface SP-US of the insulation pattern layer SP. The second edge portion E2 may extend in the second oblique direction CDR2 in the first region SP-A1, and the second edge portion E2 may extend in the first oblique direction CDR1 in the second region SP-A2. The first edge portion E1 and the second edge portion E2 may have a symmetrical shape with respect to the first direction DR1. A region of the second edge portion E2, which faces the first region E1-A1 of the first edge portion E1, may be defined as a first region E2-A1, and a region of the second edge portion E2, which faces the second region E1-A2 of the first edge portion E1, may be defined as a second region E2-A2.

A minimum distance MIL between the first edge portion E1 and the second edge portion E2 may be defined as a distance between a first point (or first concave point) PP1 at which the extending direction of the first edge portion E1 changes and a second point (or second concave point) PP2 at which the extending direction of the second edge portion E2 changes, in the second direction DR2. Since the top surface (or upper surface) SP-US of the insulation pattern layer SP has a shape extending in the second direction DR2, the relatively great minimum distance MIL may be ensured without increasing the length of the top surface SP-US of the insulation pattern layer SP in the first direction DR1. The shape in which the top surface SP-US of the insulation pattern layer SP extends in the second direction DR2 means that the third top surface edge portion SP-S3 is greater than the first top surface edge portion SP-S1. The third top surface edge portion SP-S3 may have a size (or length) of about 5 micrometers to about 8 micrometers, and the first top surface edge portion SP-S1 may have a size (or length) of about 3 micrometers to about 5 micrometers.

In case that the length of the top surface SP-US of the insulation pattern layer SP in the first direction DR1 increases, the area of the first contact hole CNT1 illustrated in FIG. 7A is reduced relatively. The top surface SP-US of the insulation pattern layer SP having a rectangular shape is just an example, and the shape of the top surface SP-US of the insulation pattern layer SP is not limited thereto.

As described above, the minimum distance MIL may be defined as a distance between the first point (or first concave point) PP1 of the first edge portion E1 and the second point (or second concave point) PP2 of the second edge portion E2. For example, a first maximum distance MAL1 may be defined as a distance between the first side surface SP-S1 of the insulation pattern layer SP and the first point (or first concave point) PP1 of the first edge portion E1 of the second conductive pattern layer CL2. Further, a second maximum distance MAL2 may be defined as a distance between the second side surface SP-S2 of the insulation pattern layer SP and the second point (or second concave point) PP2 of the second edge portion E2 of the second conductive pattern layer CL2. The first and second maximum distances MAL1 and MAL2 may be about 0.5 micrometers to about 1.5 micrometers. For example, the first and second maximum distances MAL1 and MAL2 may be substantially equal to each other or may be different from each other.

FIGS. 7F to 7H illustrate a photolithography process of forming the second conductive pattern layer CL2 described with reference to FIGS. 7A to 7E. FIGS. 7F to 7H illustrate the process based on a cross section corresponding to line IV-IV' in FIG. 7E.

As illustrated in FIG. 7F, the insulation pattern layer SP may be formed on the first conductive pattern layer CL1. Thereafter, a metal layer ML that covers the insulation pattern layer SP may be formed. A photoresist layer PRL may be formed on the metal layer ML. The negative photoresist layer PRL is illustrated as an example.

An exposure mask MSK may include an opening portion M-OP. The opening portion M-OP may have substantially the same shape as the second conductive pattern layer CL2 illustrated in FIG. 7A in a plan view. In case that the light exposure is performed as in FIG. 7F and the light-exposed photoresist layer PRL may be developed, a photoresist pattern layer PRP illustrated in FIG. 7G may be formed. Then, an etching process may be performed to form a conductive pattern layer only in a region protected by the photoresist pattern layer PRP. For example, the second conductive pattern layer CL2 having an example shape may be formed as in FIG. 7H. Thereafter, the photoresist pattern layer PRP may be removed.

Referring to FIG. 7F, in order to form the bottleneck region BA in FIG. 7E, a first distance MSL1 between an edge portion of the opening portion M-OP of the mask and the first side surface SP-S1 may be set to correspond to the first maximum distance MAL1 in FIG. 7E, and a second distance MSL2 between another edge portion of the opening portion M-OP of the mask and the second side surface SP-S2 may be set to correspond to the second maximum distance MAL2 in FIG. 7E. In case that the first and second maximum distances MAL1 and MAL2 are not ensured, for example, the second conductive pattern layer CL2 may be formed so as not to have the bottleneck region BA, the edge portion of the opening portion M-OP of the mask may be aligned with the second side surface SP-S2.

For example, light leakage may occur in the opening portion M-OP of the mask and thus, a side surface region SA of the photoresist layer PRL, which corresponds to the second side surface SP-S2, may be exposed to light. The side surface region SA of the photoresist layer PRL may be remained by the light leakage in the developing process. Accordingly, a remaining photoresist pattern layer PRP-R illustrated with a dotted line in FIG. 7G may be formed. For example, the side surface region of the photoresist layer PRL may remain also in a region corresponding to the first side surface SP-S1.

The remaining photoresist pattern layer PRP-R may protect the metal layer ML therebelow in the etching process. Unlike that illustrated in FIG. 7H, the second conductive pattern layer CL2 may cover the first side surface SP-S1 and the second side surface SP-S2. The insulation pattern layer SP of which the first side surface SP-S1 and the second side surface SP-S2 are covered may cause a defect in which the insulation pattern layer SP is not readily restored to the shape before the bonding process from the shape after the bonding process.

FIG. 8 illustrates a driving chip DC as an example of an electronic component. FIG. 8 illustrates a state in which a bump BP of the driving chip DC is in contact with a bottleneck region BA of a second conductive pattern layer CL2.

The bump BP of the driving chip DC may pass through a first adhesive layer CF1 by the bonding pressure to be in contact with the bottleneck region BA of the second conductive pattern layer CL2. Since the bottleneck region BA of the second conductive pattern layer CL2 protrudes toward the bump BP, the bottleneck region BA and the bump BP may be in close contact with each other, and contact resistance therebetween may be reduced. A conductive ball may be omitted, and accessibility between a signal pad DP-PD and the bump BP may be improved to reduce the bonding pressure. The insulation pattern layer SP of which the side surfaces are exposed from the second conductive pattern layer CL2 may be readily restored to the shape before the bonding process from the shape after the bonding process.

Figure 9A:
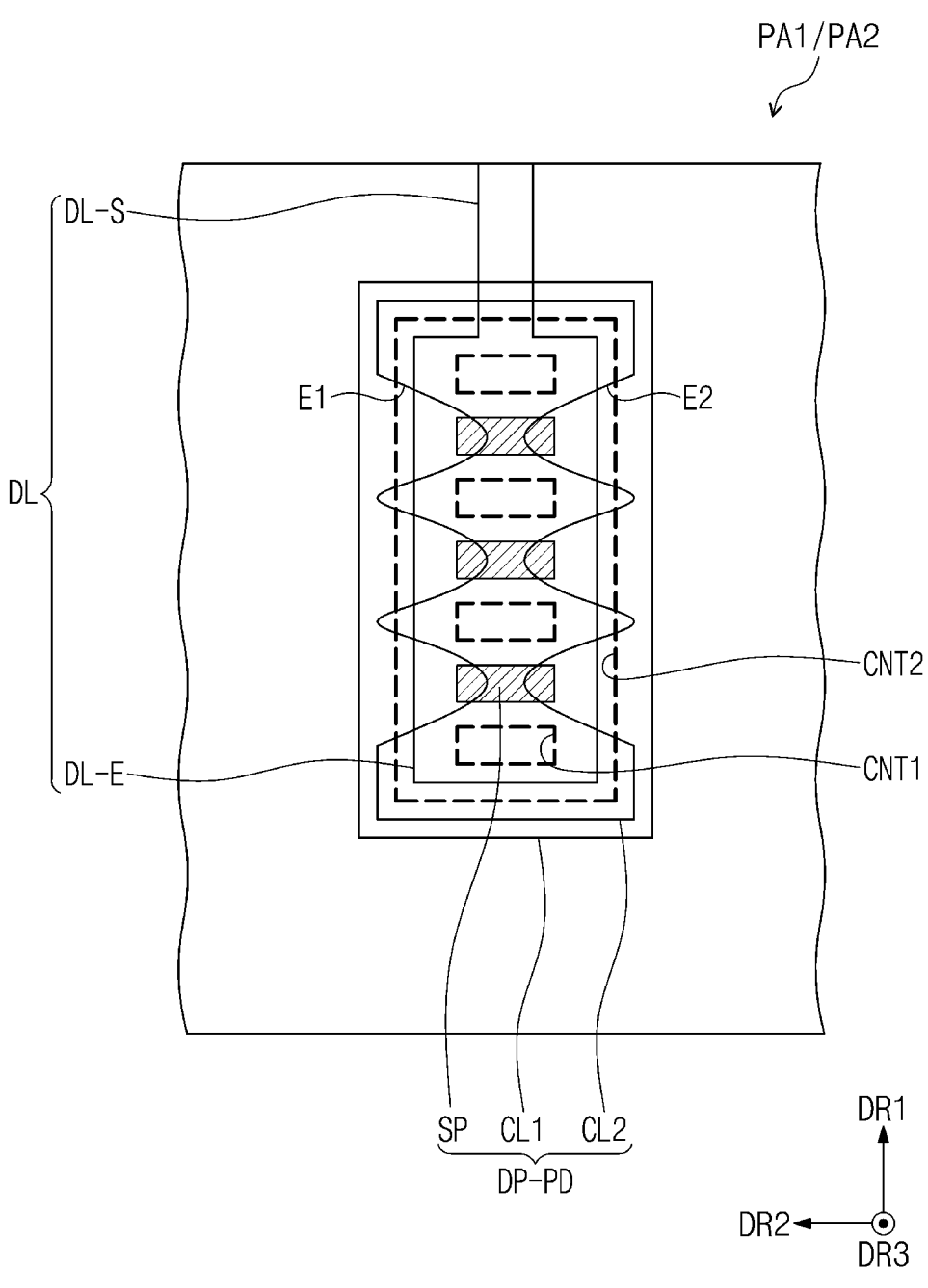
FIGS. 9A and 9B are schematic plan views of a pad region according to an embodiment.
Figure 9B:
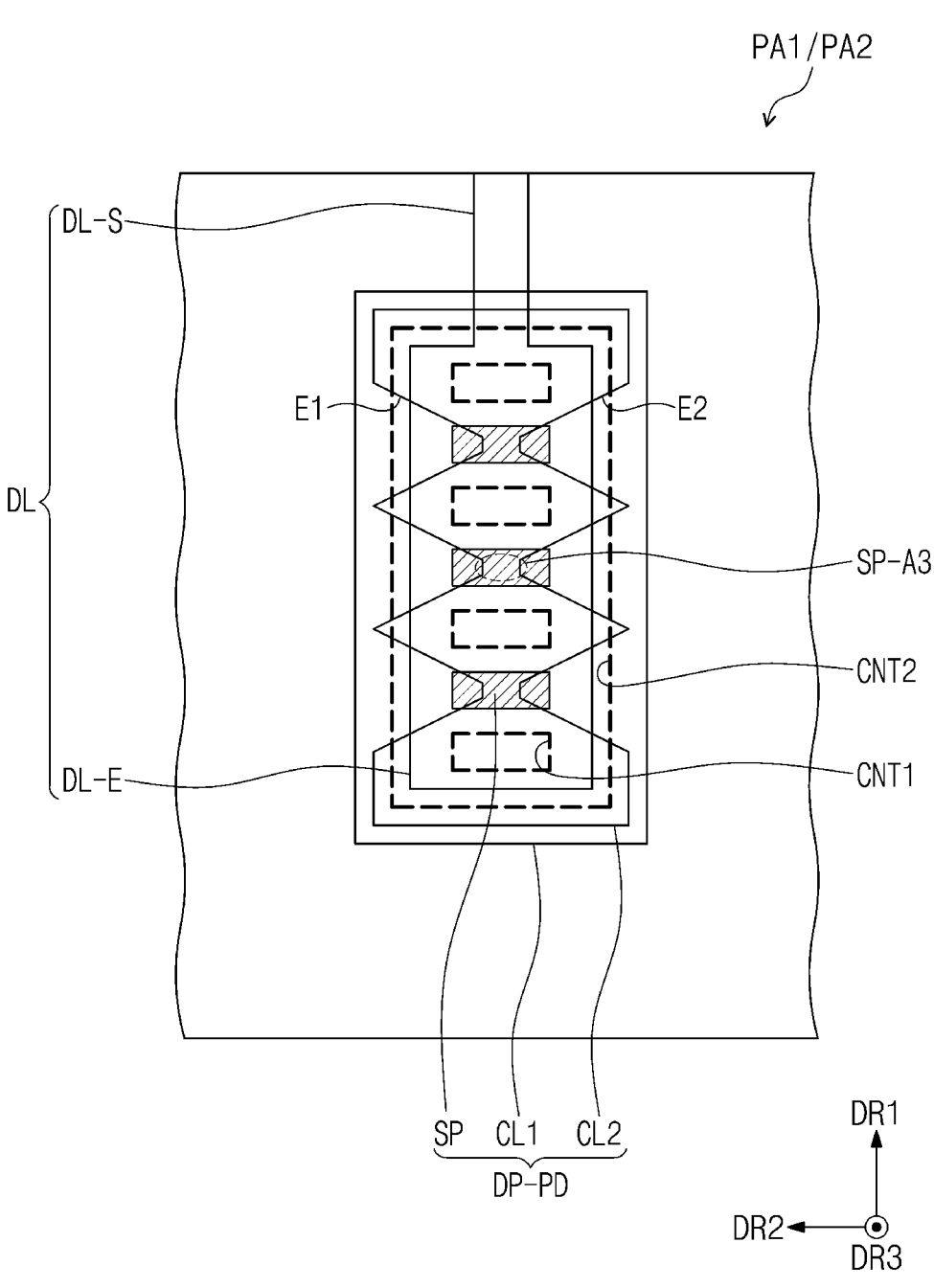

FIGS. 9A and 9B are schematic plan views of pad regions PA1 and PA2 according to an embodiment. Hereinafter, for the detailed description of components of FIGS. 9A and 9B, which is the same as/similar to the components described with reference to FIGS. 7A to 7H, refer to the description with reference to FIGS. 7A to 7H.

Referring to FIG. 9A, a first edge portion E1 and a second edge portion E2 may each include a curved region. The first edge portion E1 and the second edge portion E2 may be curved in the first region SP-A1 and the second region SP-A2 described with reference to FIG. 7E.

Referring to FIG. 9B, a region in which a distance between the first edge portion E1 and the second edge portion E2 is uniform may be further included on a top surface (or upper surface) SP-US of an insulation pattern layer SP. A third region SP-A3 in which the distance between the first edge portion E1 and the second edge portion E2 is uniform may be further disposed between the first region SP-A1 and the second region SP-A2 described with reference to FIG. 7E. The first edge portion E1 and the second edge portion E2 may each extend in the first direction DR1 in the third region SP-A3.

Figure 10A:
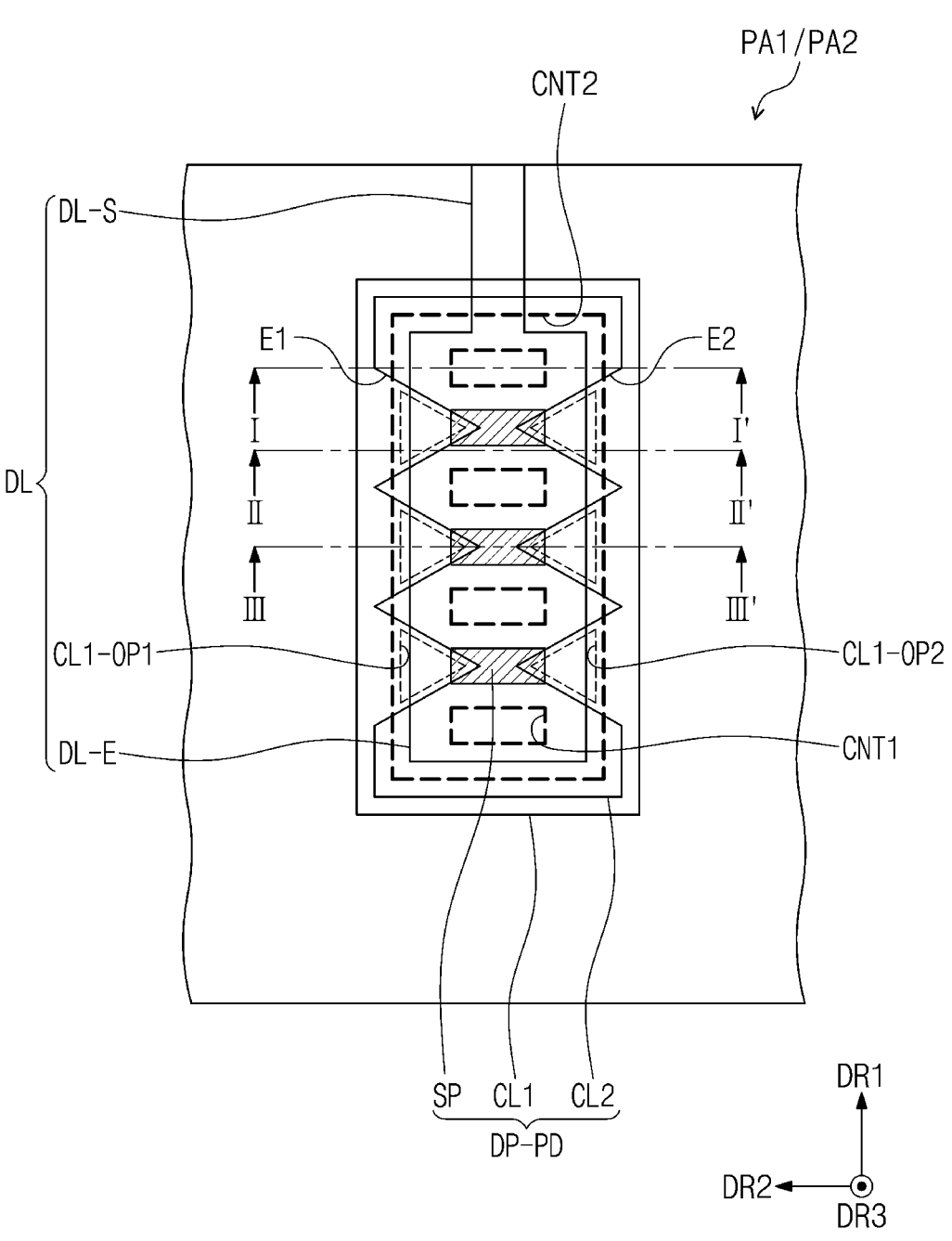
FIG. 10A is a schematic plan view of a pad region according to an embodiment.
Figure 10B:
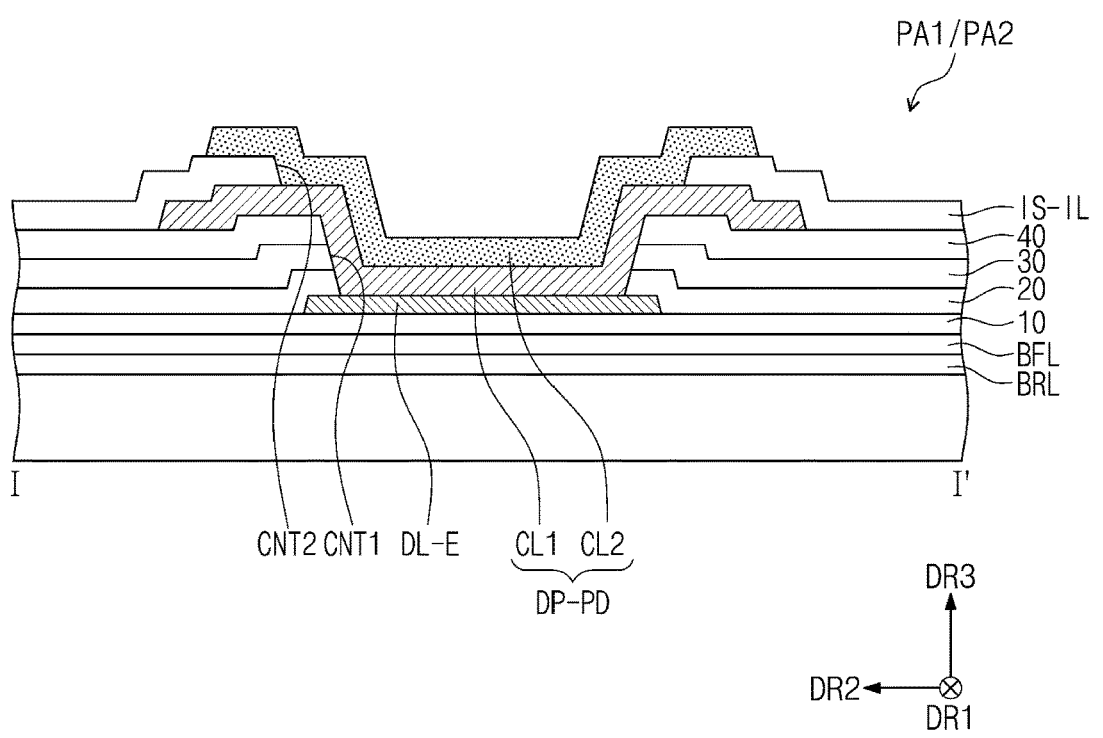
FIGS. 10B to 10D are schematic cross-sectional views corresponding to FIG. 10A.
Figure 10C:
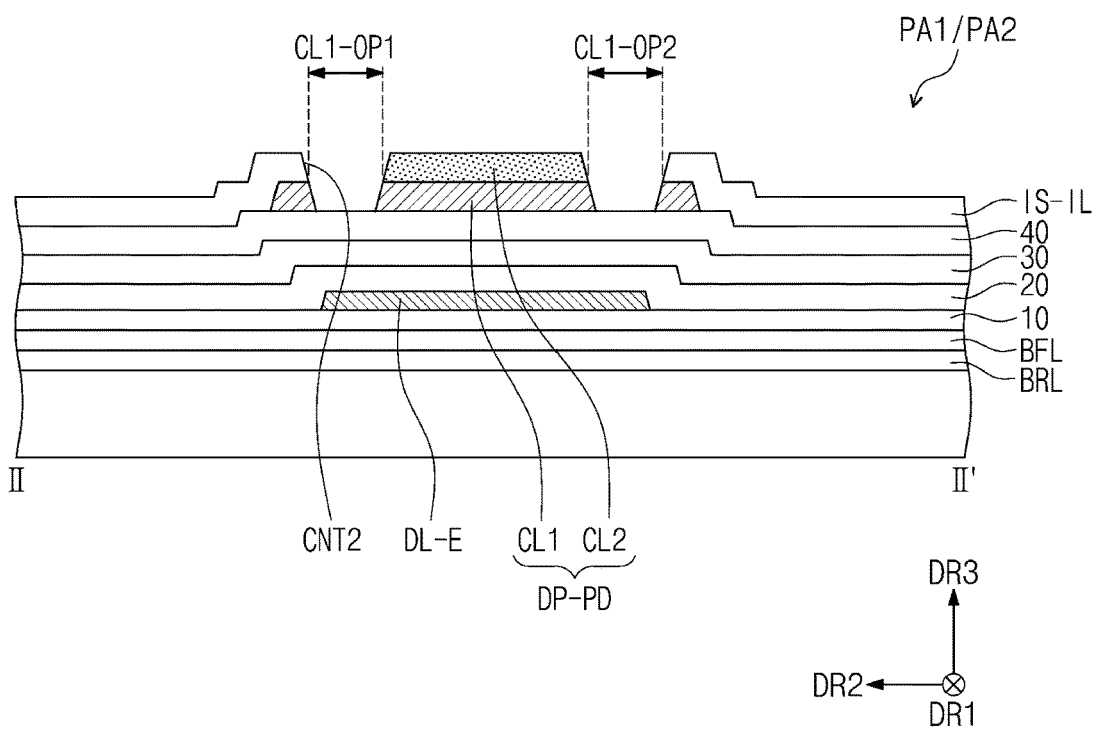
Figure 10D:
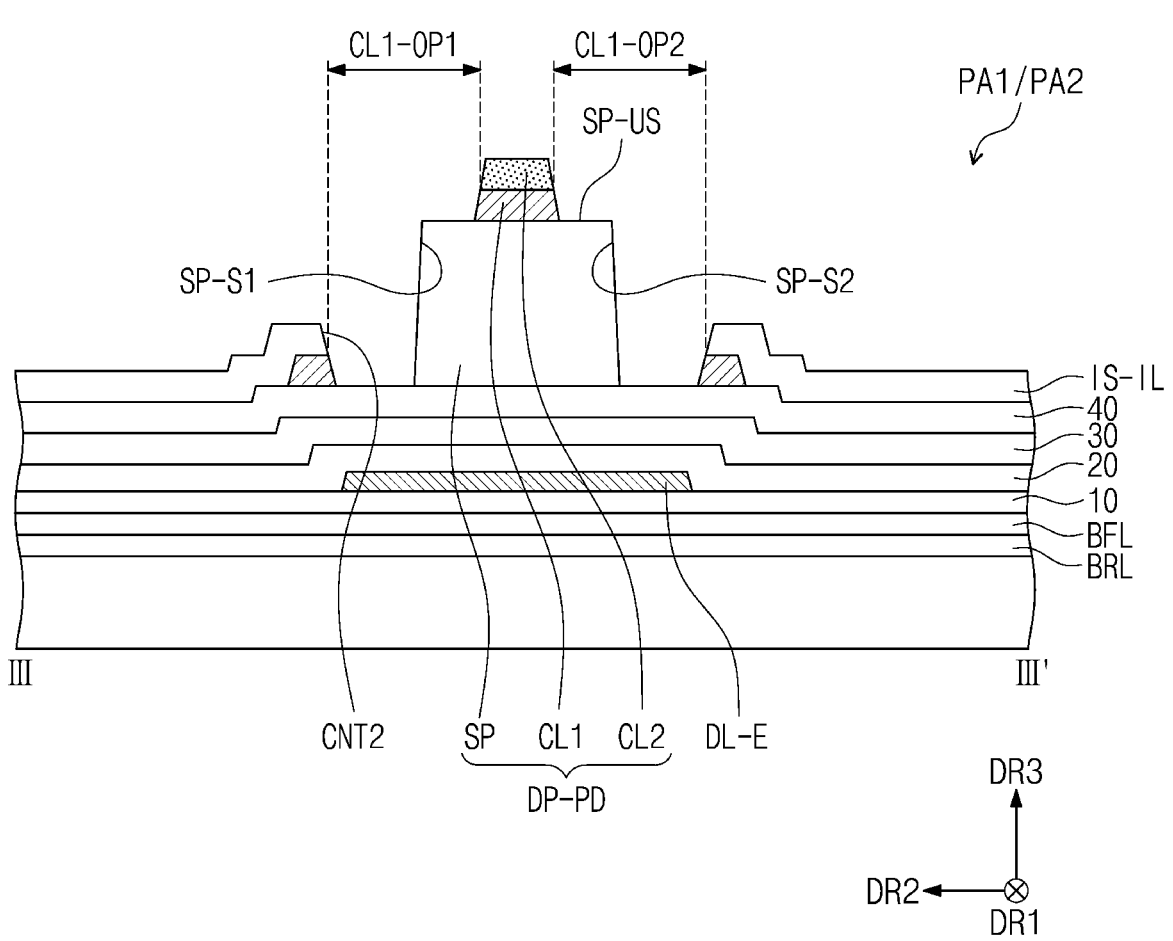

FIG. 10A is a schematic plan view of pad regions PA1 and PA2 according to an embodiment. FIGS. 10B to 10D are schematic cross-sectional views corresponding to FIG. 10A. Hereinafter, for the detailed description of components of FIGS. 10A to 10D, which is the same as/similar to the components described with reference to FIGS. 7A to 7H, refer to the description with respect to FIGS. 7A to 7H.

Referring to FIG. 10A, a plurality of opening portions CL1-OP1 and CL1-OP2 may be defined in a first conductive pattern layer CL1. The plurality of opening portions CL1-OP1 and CL1-OP2 include first opening portions CL1-OP1 and second opening portions CL1-OP2. The first opening portions CL1-OP1 may be disposed to correspond to (or to overlap) insulation pattern layers SP, respectively, and each of the first opening portions CL1-OP1 may be disposed at a side of a corresponding insulation pattern layer SP. The first opening portions CL1-OP1 may be arranged in the first direction DR1. The second opening portions CL1-OP2 may be disposed to correspond to (or to overlap) the insulation pattern layers SP, respectively, and each of the second opening portions CL1-OP2 may be disposed at another side of a corresponding insulation pattern layer SP. The second opening portions CL1-OP2 may be arranged in the first direction DR1.

One first opening portion CL1-OP1 and one second opening portion CL1-OP2 may be paired, may face each other in the second direction DR2, and may be symmetrical with respect to the first direction DR1. FIG. 10A illustrates that the first opening portion CL1-OP1 and the second opening portion CL1-OP2 are spaced apart from a first edge portion E1 and a second edge portion E2, respectively. However, an edge portion defining the first opening portion CL1-OP1 may be aligned with the first edge portion E1, and an edge portion defining the second opening portion CL1-OP2 may be aligned with the second edge portion E2. The edge portion defining the first opening portion CL1-OP1 and the edge portion defining the second opening portion CL1-OP2 may be aligned with an edge portion defining a second contact hole CNT2.

The alignment relationship between the edge portions described above is illustrated in FIGS. 10C and 10D. The first opening portion CL1-OP1 and the second opening portion CL1-OP2 may be formed in the photolithography process of forming a second conductive pattern layer CL2. A sensor insulation layer IS-IL may correspond to a mask defining an edge portion at a side of each of the first opening portion CL1-OP1 and the second opening portion CL1-OP2. The photoresist pattern layer PRP illustrated in FIG. 7G may correspond to a mask defining an edge portion at another side of each of the first opening portion CL1-OP1 and the second opening portion CL1-OP2 that are aligned in the second conductive pattern layer CL2.

Referring to FIGS. 10A to 10D, the insulation pattern layer SP may be formed before the first conductive pattern layer CL1 is formed. The insulation pattern layer SP may be in contact with a fourth insulation layer 40 that is a first group of insulation layers. A portion of the first conductive pattern layer CL1 may be formed on a top surface (or upper surface) SP-US of the insulation pattern layer SP. A portion of the second conductive pattern layer CL2 may be disposed on the portion of the first conductive pattern layer CL1. The first opening portion CL1-OP1 and the second opening portion CL1-OP2 may be formed so as to expose a portion of the top surface SP-US of the insulation pattern layer SP, a first side surface SP-S1, and a second side surface SP-S2.

Figure 11A:
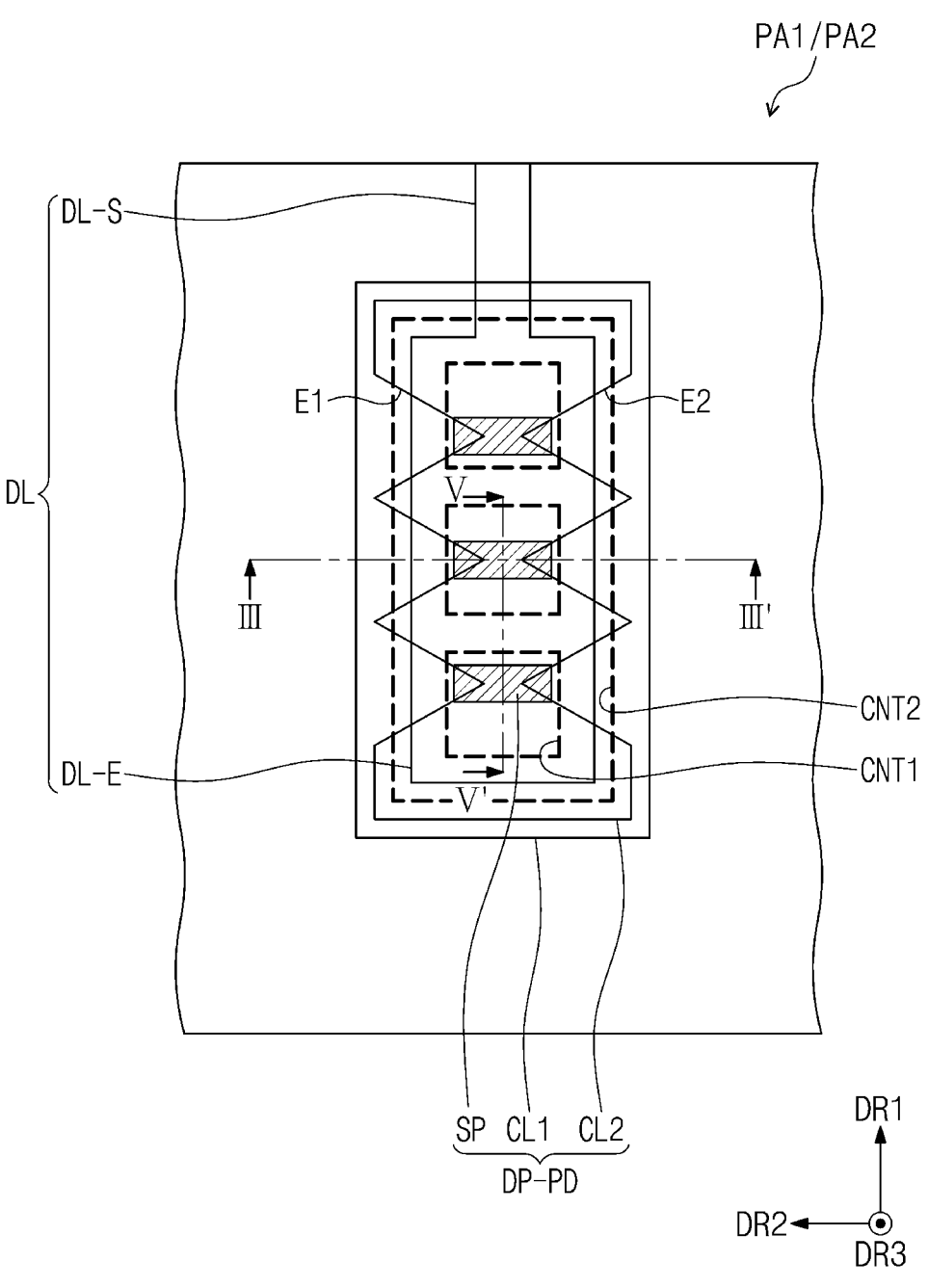
FIG. 11A is a schematic plan view of a pad region according to an embodiment.
Figure 11B:
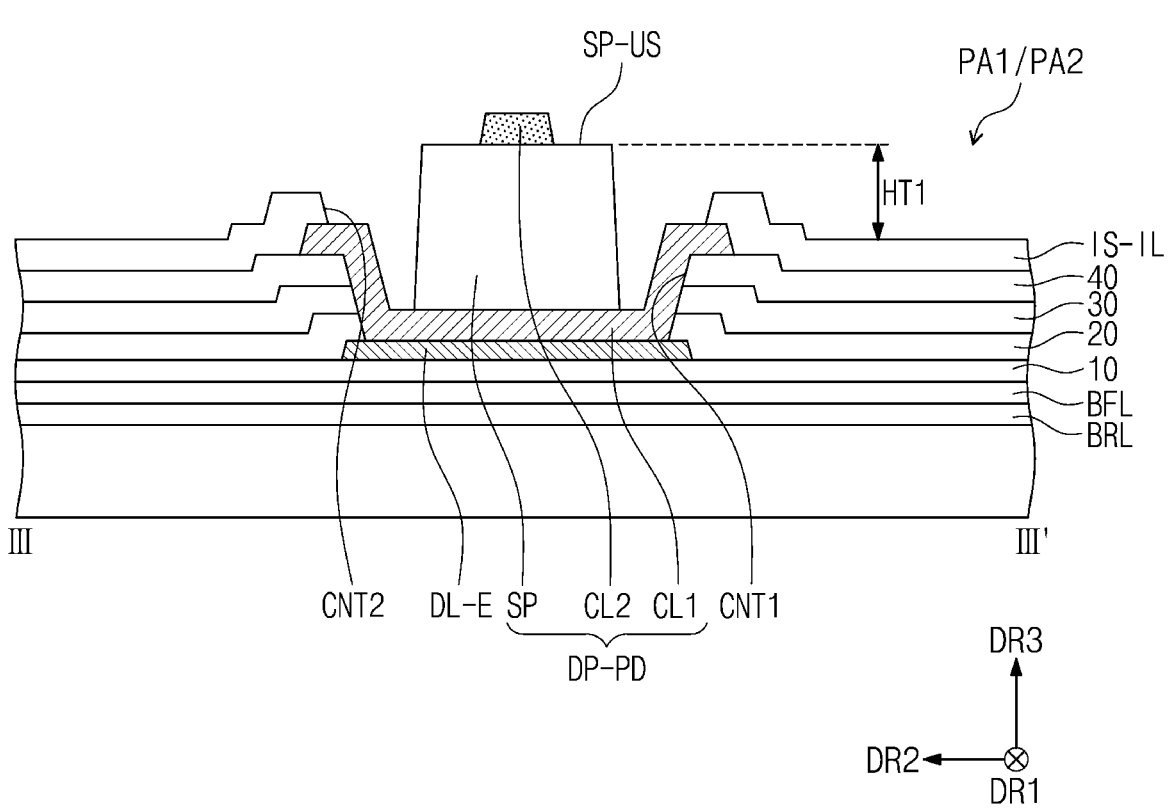
FIGS. 11B and 11C are schematic cross-sectional views corresponding to FIG. 11A.
Figure 11C:
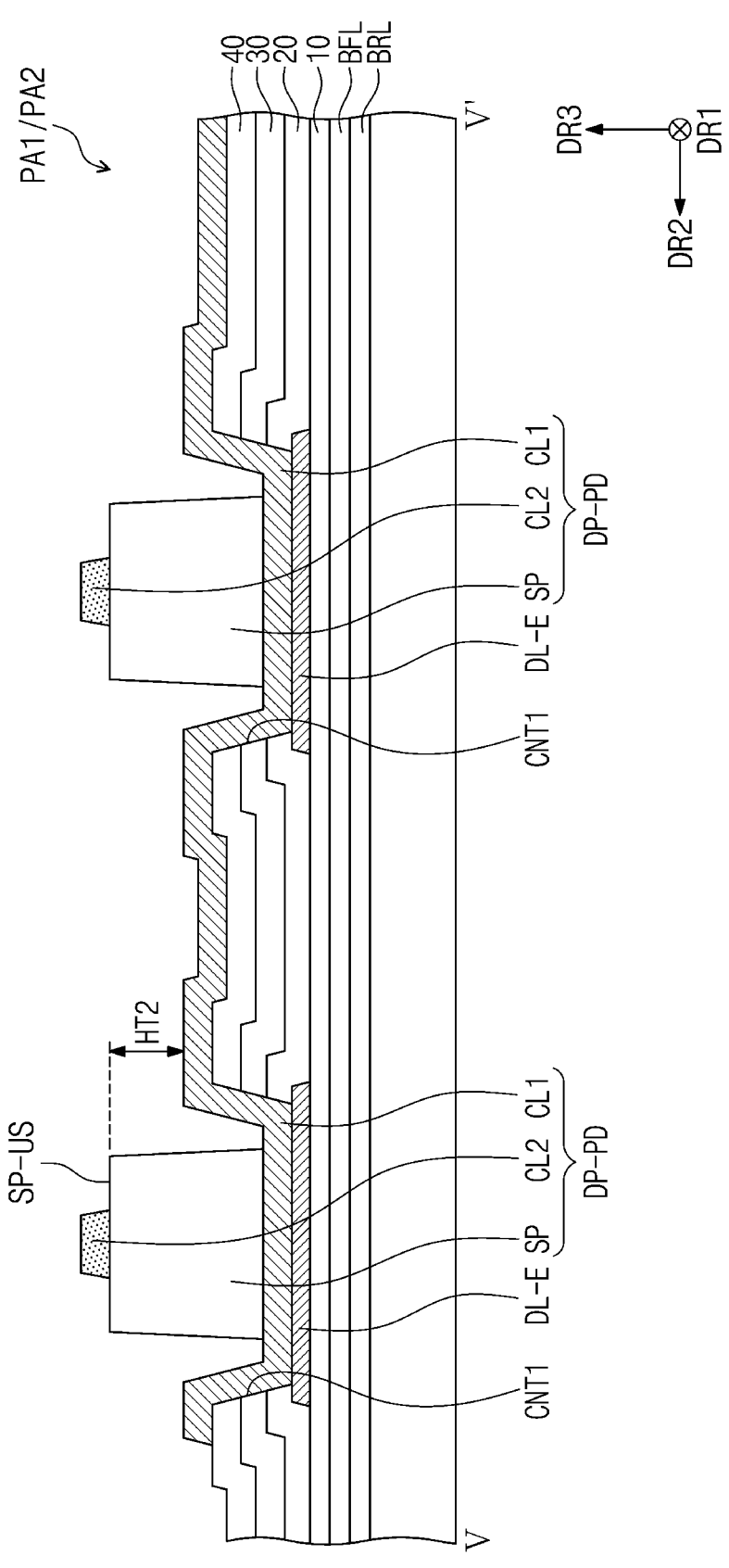

FIG. 11A is a schematic plan view of pad regions PA1 and PA2 according to an embodiment. FIGS. 11B and 11C are schematic cross-sectional views corresponding to FIG. 11A. Hereinafter, for the detailed description of components with reference to FIGS. 11A, 11B, and 11C, which is the same as/similar to the components described with reference to FIGS. 7A to 7H, refer to the description with reference to FIGS. 7A to 7H.

Referring to FIG. 11A, each of insulation pattern layers SP may overlap a corresponding contact hole CNT1 among first contact holes CNT1. Each of the insulation pattern layers SP may be disposed inside the corresponding first contact hole CNT1 among the first contact holes CNT1 in a plan view. The insulation pattern layer SP may be in contact with a top surface (or upper layer) of a first conductive pattern layer CL1 inside the first contact hole CNT1.

Referring to FIGS. 11B and 11C, a height difference HT1 between a top surface (or upper surface) SP-US of the insulation pattern layer SP and a top surface (or upper surface) of a sensor insulation layer IS-IL, and a height difference HT2 between the top surface SP-US of the insulation pattern layer SP and a top surface (or upper surface) of the first conductive pattern layer CL1, may be relatively reduced as compared to a height difference between the top surface SP-US of the insulation pattern layer SP and a top surface (or upper surface) of the sensor insulation layer IS-IL or a top surface (or upper surface) of the first conductive pattern layer CL1 in FIGS. 7D and 7F. Accordingly, a photoresist material may be sufficiently disposed on the top surface of the insulation pattern layer SP in the forming of the photoresist layer PRL illustrated in FIG. 7F.

In case that the photoresist layer PRL is formed so as to cover a three-dimensional structure, as a stepped portion formed by the three-dimensional structure becomes smaller, the photoresist layer PRL may continuously (or sequentially) cover the three-dimensional structure. For example, in case that the photoresist layer is not sufficiently formed on the top surface of the insulation pattern layer SP, a defect in which a second conductive pattern layer CL2 has an area smaller than a reference area may occur unlike that illustrated in FIG. 7H.

Figure 12A:
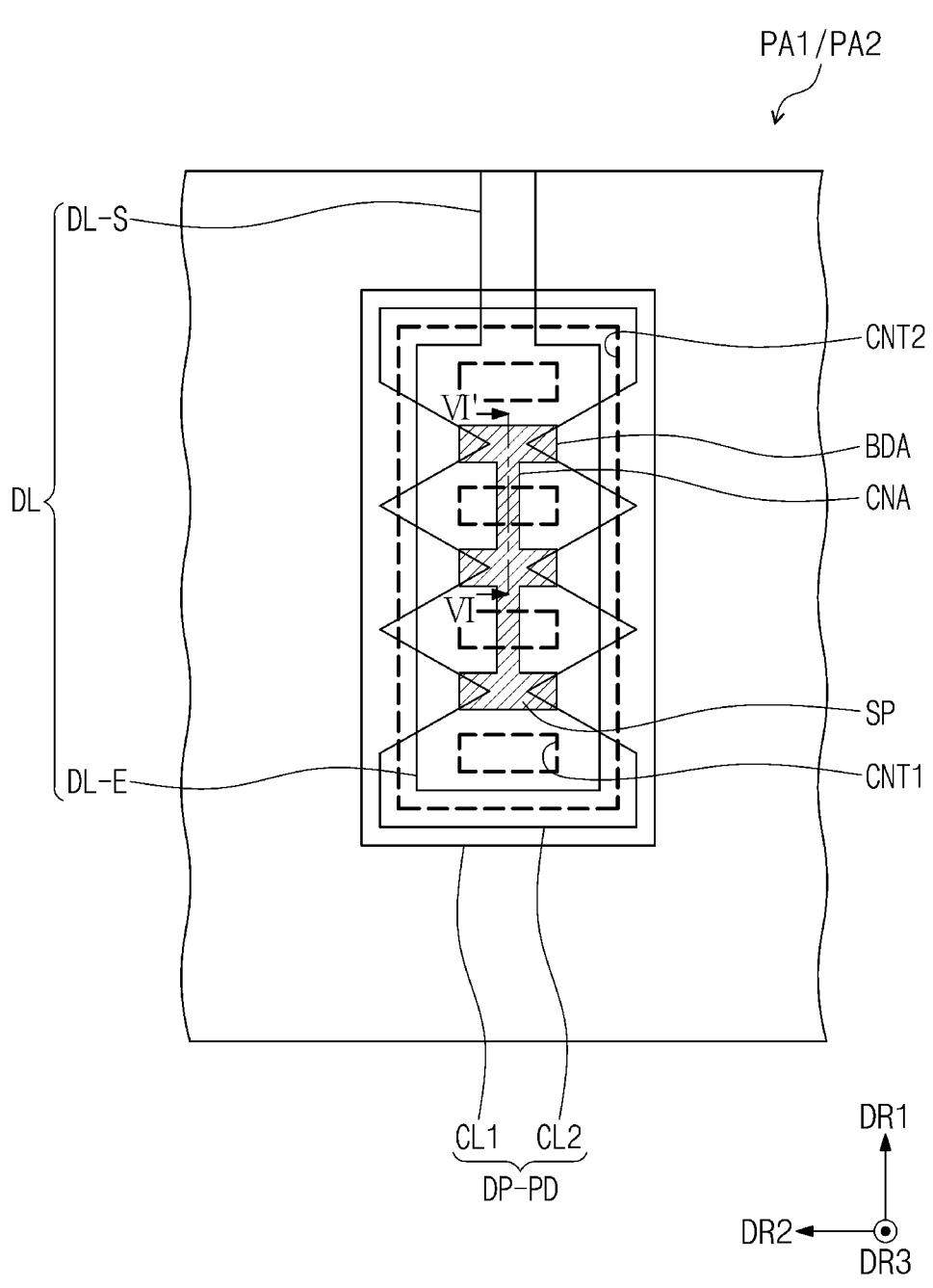
FIG. 12A is a schematic plan view of a pad region according to an embodiment.
Figure 12B:
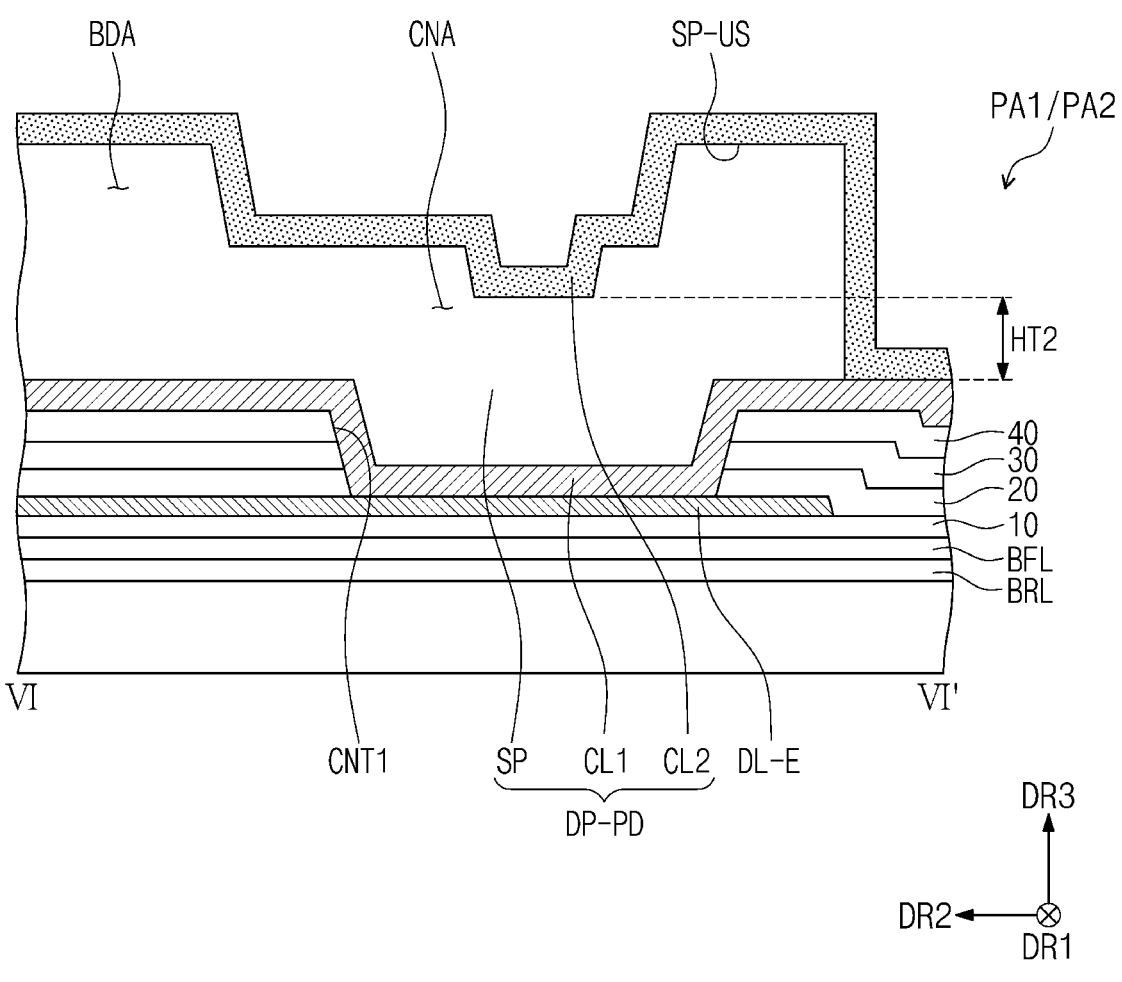
FIG. 12B is a schematic cross-sectional view corresponding to FIG. 12A.

FIG. 12A is a schematic plan view of pad regions PA1 and PA2 according to an embodiment. FIG. 12B is a schematic cross-sectional view corresponding to FIG. 12A. Hereinafter, for the detailed description of components of FIGS. 12A and 12B, which is the same as/similar to the components described with reference to FIGS. 7A to 7H, see FIGS., refer to the description with reference to 7A to 7H.

As illustrated in FIG. 12A, an insulation pattern layer SP may include bonding portions BDA extending in the second direction DR2, and at least one connection portion CNA extending in the first direction DR1. The bonding portions BDA may correspond to the insulation pattern layers SP illustrated in FIGS. 7A to 7H. The insulation pattern layer SP including three bonding portions BDA and two connection portions CNA is illustrated as an example.

Each of the connection portions CNA may be disposed between two adjacent bonding portions among the bonding portions BDA. The connection portions CNA each have a smaller width in the second direction DR2 than the bonding portions BDA. Each of the connection portions CNA may overlap a corresponding first contact hole CNT1 among first contact holes CNT1.

Referring to FIG. 12B, a height difference HT2 between a top surface (or upper surface) of the connection portion CNA overlapping the first contact hole CNT1 and a top surface (or upper surface) of the first conductive pattern layer CL1, may be relatively reduced as compared to the height difference between the top surface SP-US of the insulation pattern layer SP and the top surface of the sensor insulation layer IS-IL or the top surface of the first conductive pattern layer CL1 in FIGS. 7D and 7F. Accordingly, a photoresist material may be sufficiently disposed on the top surface of the connection portion CNA in the forming of the photoresist layer PRL illustrated in FIG. 7F.

The bonding portion BDA may have a greater stepped portion than the connection portion CNA. The photoresist material disposed on the connection portion CNA may support the photoresist material disposed on the bonding portion BDA so that the photoresist material may be sufficiently disposed on the top surface SP-US of the insulation pattern layer SP. Accordingly, like that illustrated in FIG. 7F, the photoresist layer PRL may continuously cover the insulation pattern layer SP that is a three-dimensional structure.

According to an embodiment, the anisotropic conductive adhesive layer for electrically connecting the pad regions of the electronic components to each other may be replaced with the adhesive layer having the low viscosity. The conductive ball may not be applied to prevent the defects caused by the conductive ball, and the adhesive layer having the low viscosity may be used to perform the bonding process with the low bonding pressure. The bonding pressure may be reduced to reduce the physical damages of the display panel or the electronic component, which occur in the bonding process.

Due to the shape in which the portion of the top surface of the insulation pattern layer and the portion of the side surface thereof are exposed by the second conductive pattern layer may, the insulation pattern layer may be more readily restored to the shape before the bonding process from the shape after the bonding process.

The partial region of the second conductive pattern layer may have the shape such as the bottleneck, on the top surface of the insulation pattern layer, so that the portion of the second conductive pattern layer, which corresponds to the side surface of the insulation pattern layer, may be readily removed during the etching process.

The top surface of the insulation pattern layer may have the shape extending in the direction in which the minimum width of the second conductive pattern layer having the bottleneck shape is defined. The area of the top surface of the insulation pattern layer may be reduced, and also the minimum width of the second conductive pattern layer may be ensured. The side surface of the insulation pattern layer may be readily exposed during the manufacturing of the second conductive pattern layer.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a base layer;
a pixel disposed on the base layer;
a signal line electrically connected to the pixel;
a signal pad connected to the signal line; and
a plurality of insulation layers disposed on the base layer, wherein
the signal pad comprises:
   a first conductive pattern layer connected to the signal line,
   a second conductive pattern layer connected to the first conductive pattern layer, and
   at least one insulation pattern layer disposed between the signal line and the second conductive pattern layer in a cross-sectional view and overlapping the second conductive pattern layer in a plan view,
the plurality of insulation layers comprise a first group of insulation layers disposed between the signal line and the first conductive pattern layer,
the signal line and the first conductive pattern layer are connected to each other through a first contact hole formed in the first group of insulation layers,
the second conductive pattern layer exposes a portion of an upper surface and a side surface of the at least one insulation pattern layer,
the second conductive pattern layer comprises a first edge portion and a second edge portion that are disposed on the upper surface of the at least one insulation pattern layer and face each other in a second direction intersecting a first direction, and
a distance between the first edge portion and the second edge portion decreases as moving along the first direction in a first region of the upper surface of the at least one insulation pattern layer, and increases as moving along the first direction in a second region of the upper surface of the at least one insulation pattern layer.

2. The display device of claim 1, wherein:
the plurality of insulation layers further comprise a second group of insulation layers disposed between the first conductive pattern layer and the second conductive pattern layer; and
the first conductive pattern layer and the second conductive pattern layer are connected to each other through a second contact hole formed in the second group of insulation layers.

3. The display device of claim 2, wherein the first contact hole is disposed inside the second contact hole in a plan view.

4. The display device of claim 1, wherein the at least one insulation pattern layer is disposed outside the first contact hole in a plan view.

5. The display device of claim 1, wherein the at least one insulation pattern layer is in contact with an upper surface of the first conductive pattern layer.

6. The display device of claim 1, wherein
the first contact hole includes a plurality of first contact holes, and
the plurality of first contact holes are disposed along the first direction.

7. The display device of claim 6, wherein:
the at least one insulation pattern layer includes a plurality of insulation pattern layers,
the plurality of insulation pattern layers are disposed along the first direction, and
each of the plurality of insulation pattern layers is disposed between two adjacent contact holes among the plurality of first contact holes.

8. The display device of claim 1, wherein:
the second conductive pattern layer comprises:
a first region overlapping the first contact hole in a plan view, and
a second region overlapping the at least one insulation pattern layer in a plan view; and
a width of the first region of the second conductive pattern layer in the second direction is greater than a width of the second region of the second conductive pattern layer in the second direction.

9. The display device of claim 1, wherein
the upper surface of the at least one insulation pattern layer comprises:
first and second upper surface edge portions substantially extending in the first direction, and
third and fourth upper surface edge portions substantially extending in the second direction, and
the third upper surface edge portion is greater than the first upper surface edge portion.

10. The display device of claim 9, wherein a maximum distance between a concave point of the first edge portion and the first upper surface edge portion is about 0.5 micrometers to about 1.5 micrometers.

11. The display device of claim 9, wherein:
the third upper surface edge portion has a length of about 5 micrometers to about 8 micrometers; and
the first upper surface edge portion has a length of about 3 micrometers to about 5 micrometers.

12. The display device of claim 1, wherein the at least one insulation pattern layer is disposed inside the first conductive pattern layer in a plan view.

13. The display device of claim 1, wherein the at least one insulation pattern layer is in contact with an upper surface of the first group of insulation layers.

14. The display device of claim 13, wherein the second conductive pattern layer is disposed on an upper surface of the first conductive pattern layer.

15. The display device of claim 14, wherein an opening portion, which exposes the portion of the upper surface of the at least one insulation pattern layer and the side surface of the at least one insulation pattern layer, is formed in the second conductive pattern layer.

16. The display device of claim 1, wherein:
the plurality of insulation layers further comprise a second group of insulation layers disposed between the first conductive pattern layer and the second conductive pattern layer,
the first conductive pattern layer and the second conductive pattern layer are connected to each other through a second contact hole formed in the second group of insulation layers, and the at least one insulation pattern layer is disposed inside the first contact hole and the second contact hole in a plan view.

17. The display device of claim 16, wherein the at least one insulation pattern layer is in contact with the upper surface of the first conductive pattern layer inside the first contact hole and the second contact hole in a plan view.

18. The display device of claim 1, wherein:
the first contact hole includes a plurality of first contact holes,
the plurality of first contact holes are disposed in the first direction, and
the at least one insulation pattern layer comprises:
bonding portions disposed between the plurality of first contact holes in the first direction, and
a connection portion connecting the bonding portions to each other and overlapping a corresponding contact hole among the plurality of first contact holes.

19. A display device comprising:
a base layer;
a pixel disposed on the base layer;
a signal line electrically connected to the pixel;
a signal pad connected to the signal line; and
a plurality of insulation layers disposed on the base layer, wherein
the signal pad comprises:
a first conductive pattern layer connected to the signal line,
a second conductive pattern layer connected to the first conductive pattern layer, and
at least one insulation pattern layer disposed between the signal line and the second conductive pattern layer in a cross-sectional view and overlapping the second conductive pattern layer in a plan view,
the plurality of insulation layers comprises a first group of insulation layers disposed between the signal line and the first conductive pattern layer,
the signal line and the first conductive pattern layer are connected to each other through a first contact hole formed in the first group of insulation layers,
the second conductive pattern layer exposes a portion of an upper surface and a side surface of the at least one insulation pattern layer,
the second conductive pattern layer comprises a first edge portion and a second edge portion that face each other in a second direction intersecting a first direction,
the upper surface of the at least one insulation pattern layer comprises:
a first upper surface edge portion facing the first edge portion, and
a second upper surface edge portion facing the second edge portion,
a distance between the first edge portion and the first upper surface edge portion increases as moving along the first direction in a first region of the upper surface of the at least one insulation pattern layer, and decreases as moving along the first direction in a second region of the upper surface of the at least one insulation pattern layer.

* * * * *